US012658671B2

(12) United States Patent
Leisher et al.

(10) Patent No.: US 12,658,671 B2
(45) Date of Patent: Jun. 16, 2026

(54) SEGMENTED CONTACT FOR CURRENT CONTROL IN SEMICONDUCTOR LASERS AND OPTICAL AMPLIFIERS

(71) Applicant: Freedom Photonics LLC, Goleta, CA (US)

(72) Inventors: Paul Orville Leisher, Livermore, CA (US); Jenna Nicole Campbell, Santa Barbara, CA (US); Michelle Helena Labrecque, Goleta, CA (US)

(73) Assignee: Freedom Photonics, LLC, Santa Barbara, CA (US)

( * ) Notice: Subject to any disclaimer, the term of this patent is extended or adjusted under 35 U.S.C. 154(b) by 874 days.

(21) Appl. No.: 17/950,847

(22) Filed: Sep. 22, 2022

(65) Prior Publication Data

US 2023/0088485 A1 Mar. 23, 2023

Related U.S. Application Data

(60) Provisional application No. 63/247,699, filed on Sep. 23, 2021.

(51) Int. Cl.
*H01S 5/042* (2006.01)
*H01S 5/10* (2021.01)

(52) U.S. Cl.
CPC ...... *H01S 5/04254* (2019.08); *H01S 5/04256* (2019.08); *H01S 5/1003* (2013.01); *H01S 5/1064* (2013.01)

(58) Field of Classification Search
CPC ......................... H01S 5/04254; H01S 5/04256
See application file for complete search history.

(56) References Cited

U.S. PATENT DOCUMENTS

| | | | |
|---|---|---|---|
| 4,932,034 A | | 6/1990 | Usami et al. |
| 5,345,459 A | * | 9/1994 | Richardson ........... H01S 5/0427 |
| | | | 372/50.1 |
| 5,358,898 A | * | 10/1994 | Ogita ...................... H01S 5/227 |
| | | | 438/32 |

(Continued)

FOREIGN PATENT DOCUMENTS

| | | |
|---|---|---|
| JP | S58-50790 | 3/1983 |
| KR | 10-2014-0060460 | 5/2014 |

(Continued)

OTHER PUBLICATIONS

Arslan et al., "Non-uniform longitudinal current density induced power saturation in GaAs-based high power diode" Applied Physics Letters, vol. 117, Issue 20, pp. 1-5 (Nov. 16, 2020).

(Continued)

*Primary Examiner* — James A Menefee
(74) *Attorney, Agent, or Firm* — Van Pelt, Yi & James LLP

(57) ABSTRACT

Various semiconductor laser and optical amplifier designs and injection current control methods are disclosed that enable tailoring a distribution of the injection current along an active waveguide of the laser or the optical amplifier. Such configurations can be used to reduce longitudinal current crowding along the active waveguide of the laser or the optical amplifier. The electrodes and/or one or more layers of the laser or the optical amplifier may be segmented to provide a tailored longitudinal injection current distribution.

16 Claims, 11 Drawing Sheets

(56) References Cited

U.S. PATENT DOCUMENTS

| 5,450,432 | A | * | 9/1995 | Okuda | H01S 5/0625 |
| | | | | | 372/20 |
| 5,539,571 | A | * | 7/1996 | Welch | H01S 5/50 |
| | | | | | 359/344 |
| 5,781,576 | A | | 7/1998 | Kimura et al. | |
| 5,793,521 | A | | 8/1998 | O'Brien et al. | |
| 5,835,261 | A | * | 11/1998 | Tamanuki | H01S 5/04256 |
| | | | | | 359/344 |
| 5,917,972 | A | | 6/1999 | Davies | |
| 6,643,309 | B1 | * | 11/2003 | Gotoda | H01S 5/06256 |
| | | | | | 372/50.11 |
| 7,388,894 | B2 | | 6/2008 | O'Daniel et al. | |
| 7,643,207 | B2 | | 1/2010 | Dagens et al. | |
| 8,384,993 | B2 | | 2/2013 | Landais et al. | |
| 8,786,941 | B2 | | 7/2014 | Kuramoto et al. | |
| 10,355,451 | B2 | | 7/2019 | Morrison et al. | |
| 2003/0021313 | A1 | * | 1/2003 | Marsh | B82Y 20/00 |
| | | | | | 372/45.01 |
| 2007/0165685 | A1 | | 7/2007 | Mizuuchi et al. | |
| 2009/0310630 | A1 | * | 12/2009 | Takabayashi | H01S 5/04254 |
| | | | | | 372/20 |
| 2011/0243169 | A1 | * | 10/2011 | Lauer | H01S 5/1017 |
| | | | | | 372/45.01 |
| 2018/0323579 | A1 | * | 11/2018 | Kaji | G02B 6/2938 |
| 2021/0057879 | A1 | | 2/2021 | Leisher et al. | |
| 2023/0023686 | A1 | | 1/2023 | Leisher et al. | |

FOREIGN PATENT DOCUMENTS

| WO | WO 2022/261511 | 12/2022 |
| WO | WO 2023/049297 | 3/2023 |

OTHER PUBLICATIONS

Baoxue et al., "Rhombus-like stripe BA InGaAs—AlGaAs—GaAs lasers", IEEE Photonics Technology Letters, vol. 16(5):1248-1249 (2004).

Lindsey et al., "Linear tailored gain broad area semiconductor lasers", IEEE Journal of Quantum Electronics, vol. QB-23(6):775-787 (1987).

Odriozola et al., "Beam properties of 980-nm tapered lasers with separate contacts: Experiments and simulations", IEEE Journal of Quantum Electronics, vol. 45(1):42-50 (20009).

Salet et al., "1.1-W continuous-wave 1480-nm semiconductor lasers with distributed electrodes for mode shaping", IEEE Photonics Technology Letters, vol. 10(12):1706-1708 (1998).

Swertfeger et al., "Longitudinal current crowding as power limit in high power 975 nm diode lasers", 2020 IEEE Photonics Conference (IPC), pp. 1-2 (2020).

Walpole et al., "Gaussian patterned contacts for improved beam stability of 1.55-μm tapered lasers", IEEE Photonics Technology Letters, vol. 12(3):257-259 (2000).

International Search Report and Written Opinion in PCT Application No. PCT/US2022/033123, mailed on Oct. 6, 2022, in 6 pages.

International Search Report and Written Opinion in PCT Application No. PCT/US2022/044451, mailed on Jan. 26, 2023, in 13 pages.

International Preliminary Report on Patentability and Written Opinion in PCT Application No. PCT/US2022/044451, dated on Mar. 26, 2024, in 10 pages.

* cited by examiner

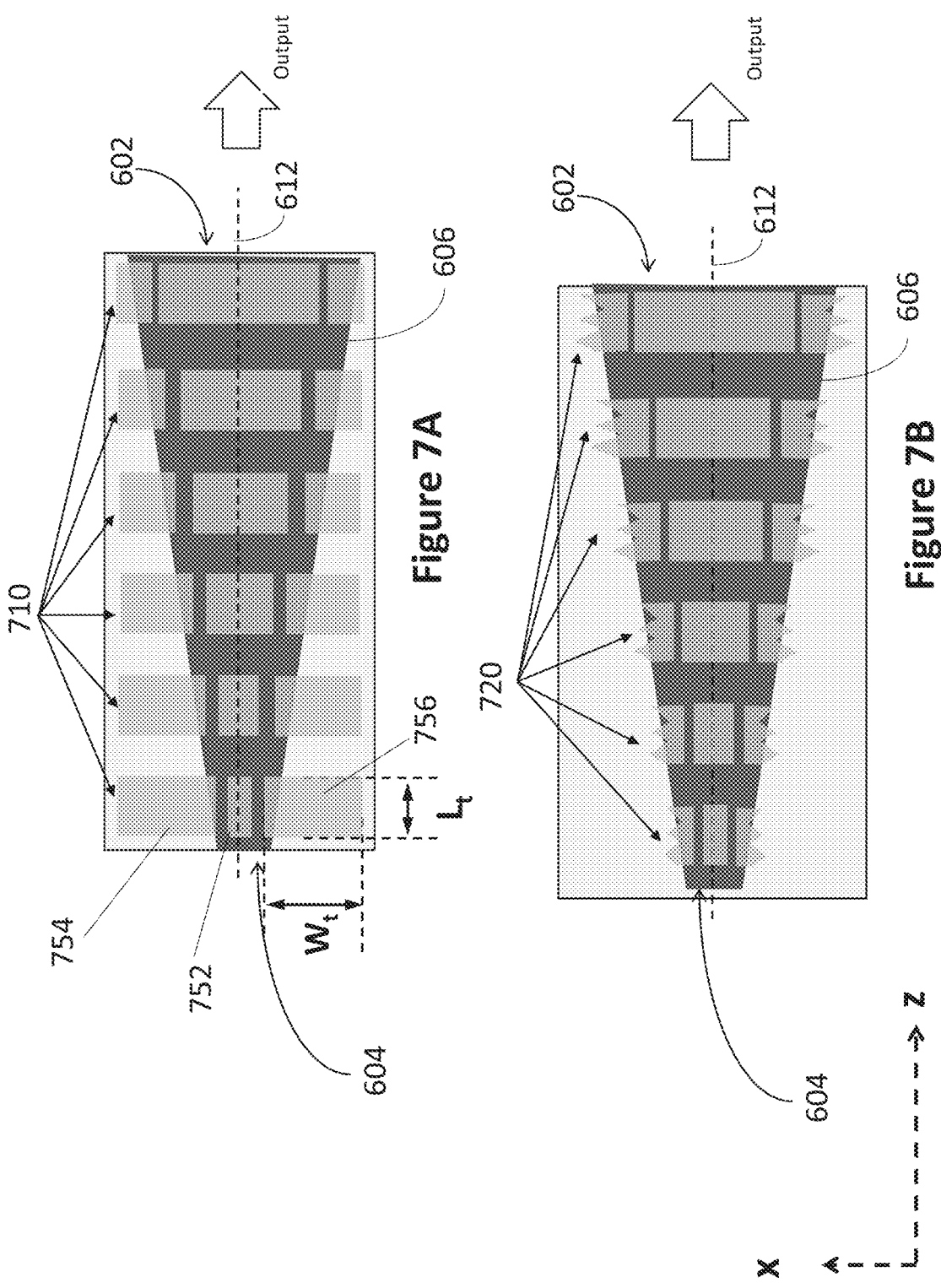

1

SEGMENTED CONTACT FOR CURRENT CONTROL IN SEMICONDUCTOR LASERS AND OPTICAL AMPLIFIERS

INCORPORATION BY REFERENCE TO ANY PRIORITY APPLICATIONS

This application claims the benefit of priority of U.S. Provisional Application No. 63/247,699 titled "Segmented Contact for Current Control in Diode Lasers", which was filed on Sep. 23, 2021, the entire disclosure of which is expressly incorporated herein by reference.

BACKGROUND

Field of the Invention

Various embodiments of this application relate to the field of semiconductor lasers and optical amplifiers and more particularly edge-emitting semiconductor lasers and optical amplifiers integrated with the lasers.

Description of the Related Art

Semiconductor lasers and optical amplifiers are widely used in telecommunications, sensing, test and measurement, pumping, LIDAR, as well as other applications. Some such applications call for the use of edge-emitting semiconductor lasers. Some such applications also may benefit from lasers and optical amplifiers having high efficiency, high output power, and high beam quality. Although it may be advantageous to increase the efficiency, output power, or beam quality of lasers and optical amplifiers, it may also be beneficial to increase two or three of these together.

SUMMARY

Example embodiments described herein have several features, no single one of which is indispensable or solely responsible for their desirable attributes. A variety of example systems and methods are provided below.

In one aspect described herein, a semiconductor laser system including: a semiconductor laser comprising: a front optical reflector, a back optical reflector, where the front and back optical reflectors are disposed with respect to each other to form a laser cavity therebetween, an active waveguide extending in a longitudinal direction between the front optical reflector and the back optical reflector, where the active waveguide includes a gain layer configured to provide optical gain to light propagating within the active waveguide, the waveguide having a waveguide length along the longitudinal direction and a waveguide width along a lateral direction perpendicular to the longitudinal direction. The semiconductor laser system further including: an electrode disposed with respect to the active waveguide where the electrode includes a plurality of separate electrically isolated longitudinal segments arranged in the longitudinal direction, where an individual longitudinal segment has a length along the longitudinal direction and a width along a lateral direction perpendicular to the longitudinal direction. The semiconductor laser system includes an electronic control system configured to provide individually controlled currents and/or voltages to individual longitudinal segments so as to increase uniformity of a longitudinal distribution of injection current provided to the gain layer.

In another aspect described herein, an optical amplifier system configured to receive input light via an input port to be guided therein, amplify at least a portion of the input light that is guided in the optical amplifier system, and output at least a portion of the amplified portion of the input light via an output port, where the optical amplifier system includes: an active waveguide extending in a longitudinal direction between the input port and the output port and having a waveguide width extending in a lateral direction perpendicular to the longitudinal direction, where the active waveguide includes a gain layer configured to provide optical gain to light guided in the active waveguide. The optical amplifier system further includes an electrode disposed with respect to the active waveguide the electrode includes a plurality of separate electrically isolated longitudinal segments arranged in the longitudinal direction, where an individual longitudinal segment has a length along the longitudinal direction and an electrode width along the lateral direction. The optical amplifier includes an electronic control system configured to provide individually controlled currents and/or voltages to individual longitudinal segments so as to increase uniformity of a longitudinal distribution of injection current provided to the gain layer.

In another aspect described herein, a semiconductor laser system including: a semiconductor laser including: a front optical reflector, a back optical reflector, the front and back optical reflectors disposed with respect to each other to form a laser cavity therebetween, an active waveguide extending in a longitudinal direction between the front optical reflector and the back optical reflector, where the active waveguide includes a gain layer configured to provide optical gain to light propagating within the active waveguide, the waveguide having a waveguide length along the longitudinal direction and a waveguide width along a lateral direction perpendicular to the longitudinal direction. The semiconductor laser further comprising, an electrode disposed with respect to the active waveguide with respect to the active waveguide to apply an electrical voltage to the gain layer to generate electrical current in the gain layer, and an electronic control system configured to provide individually controlled currents and/or voltages to individual longitudinal regions of the electrode via conductive lines distributed across the individual longitudinal regions in number so as to increase uniformity of a longitudinal distribution of injection current provided to the gain layer.

In another aspect described herein, an optical amplifier system configured to receive input light via an input port to be guided therein, amplify at least a portion of the input light that is guided in the optical amplifier system, and output at least a portion of the amplified portion of the input light via an output port, where the optical amplifier system includes: an active waveguide extending in a longitudinal direction between the input port and the output port an active waveguide extending in a longitudinal direction between the input port and the output port and having a waveguide width extending in a lateral direction perpendicular to the longitudinal direction, where the active waveguide includes a gain layer configured to provide optical gain to light guided in the active waveguide. The optical amplifier further includes an electrode disposed with respect to the active waveguide with respect to the active waveguide to apply an electrical voltage to the gain layer to generate current in the gain layer, and an electronic control system configured to provide individually controlled currents and/or voltages to individual longitudinal regions of the electrode via conductive lines distributed across the individual longitudinal regions in number so as to increase uniformity of a longitudinal distribution of injection current provided to the gain layer.

BRIEF DESCRIPTION OF THE DRAWINGS

FIG. 7A illustrates a top view of an example of longitudinally and laterally segmented top electrode disposed on a flared semiconductor laser or optical amplifier.

FIG. 7B illustrates a top view of an example of longitudinally and laterally segmented top electrode having longitudinal segments with protrusions on the lateral edges, e.g., triangular shape lateral edges, disposed on flared semiconductor laser or optical amplifier.

DETAILED DESCRIPTION

Figures 1A, 1B:
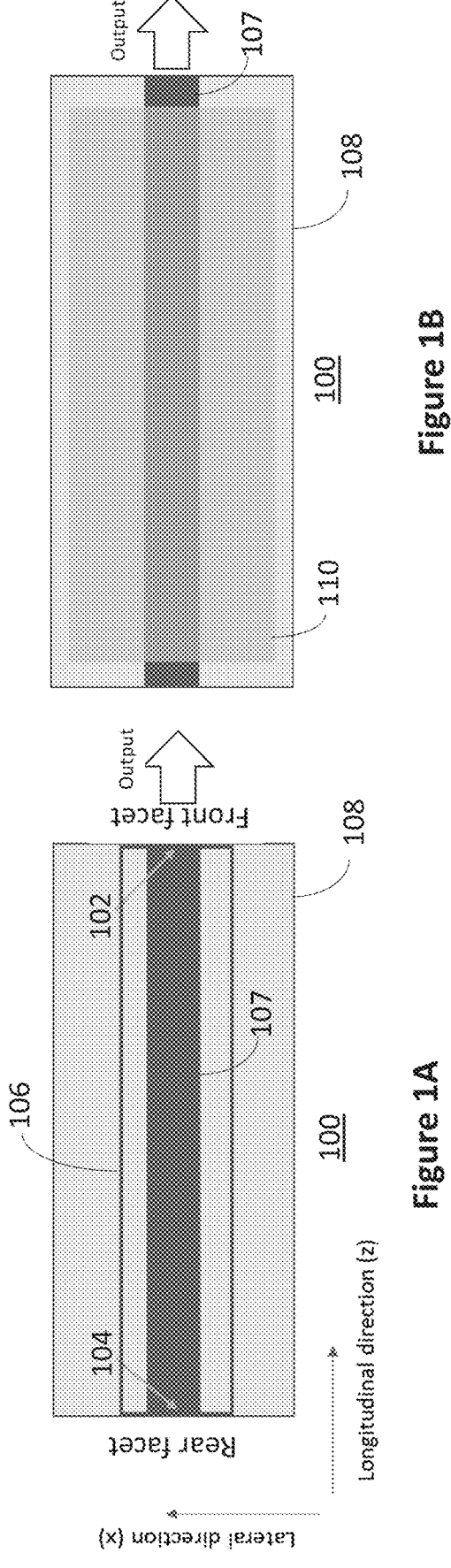
FIG. 1A illustrates a top cross-sectional view of an example semiconductor laser (or optical amplifier).
FIG. 1B illustrates a top view of the semiconductor laser (or optical amplifier) shown in FIG. 1A.

In most lasers and amplifiers, the distribution of light intensity and the corresponding photon density along the amplifier between an input port and an output port, and along the laser cavity between a front reflector and a back reflector, is nonuniform. In some cases, this nonuniform distribution of light intensity is a result of a difference between the reflectivity of the front reflector (e.g., front mirror) and the back reflector (e.g., back mirror) of the laser cavity. For example, the front reflector may have lower reflectivity to allow a portion of laser light recirculating inside the cavity to be transmitted outside of the cavity. In some cases, the nonuniform distribution of light intensity is a result of light amplification along the amplifier from the input port (e.g., rear facet) to the output port (front facet).

Similar to other lasers, semiconductor lasers may have an asymmetric design (e.g., asymmetric optical design), where the reflectivity of a front reflector is low and the reflectivity of a back reflector is high. In some cases, the semiconductor laser, may be an edge emitting laser such a Fabry-Perot laser, a Distributed Feed Back (DFB) Laser, a Distributed Bragg Grating (DBR) laser, or other types of semiconductor laser.

Optically or electrically pumping the optical gain medium (e.g., a gain layer of an active waveguide) of an optically asymmetric semiconductor laser may result in a nonuniform distribution of optical intensity (or photon density), carrier density, and gain along the length of the device between the front and back reflectors. In some cases, the optical intensity may be larger closer to the front reflector of the semiconductor laser. In some cases, the optical intensity may be larger closer to the output port of a semiconductor amplifier.

In some cases, in the regions of the gain medium where the light intensity is larger, the effective carrier lifetime can be much lower due to increased stimulated emission. For example, when the gain layer of semiconductor laser or optical amplifier is activated or pumped (e.g., by providing an electric current to the gain layer), the carrier lifetime near the output port or front reflector of the laser may be reduced. In some cases, where a uniform voltage is applied along the length of the optical amplifier or laser cavity (e.g., along a longitudinal direction extending between the front and back reflectors or between input and output ports), the local reduction of carrier lifetime may result in nonuniformity of the distribution of injection current density (e.g., injected electrical current density across the gain layer), along the optical amplifier or the laser cavity. In some cases, a nonuniform distribution of longitudinal injection current density along the optical amplifier and the laser cavity may comprise accumulation of current near a region where the optical intensity is large in the gain layer. This effect that is sometimes referred to as "longitudinal current crowding effect" may limit the efficiency of a semiconductor laser or optical amplifier and/or the optical output power generated by the semiconductor laser or optical amplifier. In some cases, the longitudinal current crowding effect may reduce the quality of the laser or light beam output by the semiconductor laser or optical amplifier.

In some cases, for example, when a length of the laser cavity or the optical amplifier is long and/or an average magnitude of the injection current density along the laser cavity or the amplifier is large, the excessive asymmetry of photon density, carrier density, and gain along the laser cavity or the optical amplifier may result in current crowding near the front reflector of the semiconductor laser. In some cases, when the laser cavity is long (e.g., in long cavity laser chips), the current crowding near or in a cavity region closer to the front reflector may reduce the current density in a cavity region closer to the rear portion of the laser (near or closer to the back reflector) and result in reduction of optical gain in the rear portion of the semiconductor laser. As such, longitudinal current crowding in a laser may limit the scaling of the laser cavity length while maintaining a certain level of efficiency (e.g., slope efficiency). Similarly, when an optical amplifier is long, the current crowding in a waveguide region closer to the output port may reduce the current density in a waveguide region closer to the output port (rear portion) and result in reduction of optical gain in the rear portion of the optical amplifier. Hence, the amount of optical output power that may be extracted from a gain layer (e.g., of a laser or an optical amplifier) with a certain efficiency may be limited by the current longitudinal crowding effect.

In some cases, the longitudinal current crowding effect may reduce the output power and/or efficiency of a semiconductor laser or optical amplifier by generating excessive heat near the output port or the front reflector. In some such cases, the excessive heat may increase the average junction temperature of the gain layer and the strength of a thermal lens formed inside the active waveguide or laser cavity. In some cases, the increased average junction temperature may reduce the efficiency and output power while a stronger thermal lens may reduce the quality of the light beam or laser beam output by the laser or the optical amplifier (e.g., due to increased slow axis blooming).

In some cases, a local wall-plug efficiency of laser light generation or amplification in a portion of the gain layer near the front reflector or output port can be relatively low due to strong gain saturation. As such, for a given amount of local pump energy provided (e.g., electrical power delivered to the semiconductor laser or optical amplifier), the portion of gain layer near the front reflector may produce less laser light compared to regions of the gain layer located farther from the front reflector or the output port (along the laser cavity, or the optical amplifier). In some cases, the asymmetric distribution of laser light intensity along the laser cavity, may increase optical absorption near the front reflector. As such, even light generated in more efficient regions of the gain layer may experience more loss as it is recirculated in the cavity. In various implementations, the magnitudes of these adverse effects may increase by increasing the pump power provided to the active waveguide. In some cases, the above-mentioned effects (caused by the longitudinal current crowding), may reduce the injection current at which the peak efficiency of laser light generation occurs. As such, the semiconductor laser may generate a lower level output power at its peak efficiency.

One possible use of the design concepts discussed herein can be to reduce the nonuniformity of current distribution along an active waveguide or the cavity of a laser, in a longitudinal direction from an input port to an output port or from a front reflector to a back reflector. In some cases, the laser can be a semiconductor laser and the optical amplifier can be a semiconductor optical amplifier. In some cases, the semiconductor laser, may be a Fabry-Perot laser, a Distributed Feed Back (DFB) Laser, or Distributed Bragg Grating (DBR) laser. In some such cases, the semiconductor laser can be an edge emitting laser such as a single mode ridge waveguide laser, a broad area laser, a flared or tapered laser, or other types of edge emitting semiconductor lasers. In some cases, the semiconductor optical amplifier or the semiconductor laser may comprise an active waveguide having a tapered or flared region. The tapered or flared region of the active waveguide may have a width along a lateral direction perpendicular to a longitudinal direction (e.g., a direction extending between the back reflector or input port and the front reflector or output port), where the width increases at least along a portion of the active waveguide in the longitudinal direction. In some examples, the width of a flared active waveguide may increase nonlinearly at least along a portion of length of the active waveguide.

In some cases, the proposed configurations disclosed herein may enable controlling the longitudinal injection current distribution along the waveguide (e.g., active waveguide) of a semiconductor optical amplifier or a cavity of a semiconductor laser using a longitudinally segmented electrode to provide independently controlled currents to different longitudinal regions of the gain layer by applying different voltages on different longitudinal electrode segments. The longitudinal direction may be a direction from the back reflector (or input port) to the front reflector (or output port) along the laser cavity and/or the active waveguide of the laser or amplifier, and may be parallel to the z-axis shown in the drawings in some cases. The longitudinally segmented electrode may comprise two or more electrically isolated longitudinal electrode segments. For example, a longitudinally segmented electrode may comprise a first longitudinal electrode segment and a second longitudinal electrode segment, with the first longitudinal electrode segment closer to the front reflector than the second longitudinal electrode segment and the second longitudinal electrode segment closer to the back reflector than the first longitudinal electrode segment. Moreover, the first longitudinal electrode segment may extend from a first end to a second end along the amplifier waveguide or the laser cavity, with the first end closer to the output port or the front reflector, and the second longitudinal electrode segment (separate from the first longitudinal segment) may extend from a third end to a fourth end along the amplifier waveguide or the laser cavity, with the fourth end closer to the input port or the back reflector than the third end such that a longitudinal distance between the first end and the output port or the front reflector is smaller than a longitudinal distance between the third end and the output port or the front reflector. Of course, the longitudinally segmented electrode may comprise more than two longitudinal electrode segments in various implementations. In some examples, the current and/or voltages provided to individual longitudinal electrode segments may be controlled (e.g., by an electronic control system or control electronics) and may in various implementations thereby tailor a distribution of the current and/or current densities injected to respective longitudinal segments of a gain layer in the active waveguide of the semiconductor laser or optical amplifier. Such control over the longitudinal injection current profile may be used in some cases to mitigate longitudinal current crowding in the amplifier waveguide or the laser cavity and potentially its impact on the efficiency of the laser light generation or light amplification by the active waveguide. In some cases, the longitudinal electrode segments may be further segmented in a lateral direction, e.g., possibly perpendicular to the longitudinal direction, to influence and/or control a lateral distribution of the current injected to the respective longitudinal segments of the gain layer. In some such cases, individual lateral segments of a longitudinal electrode segment may be electrically isolated. In some implementations, the current and/or voltage provided to individual lateral segments may be controlled by an electronic system or electronics, e.g., to influence and/or control a mode profile (e.g., a lateral mode profile) of laser light circulating within the laser cavity, a laser beam generated by the semiconductor laser, light propagating and amplifier along the amplifier waveguide, or an amplified light beam output by the optical amplifier.

In various implementations, a segmented electrode may be a top electrode disposed above the active waveguide of the semiconductor laser or optical amplifier, or a bottom electrode disposed below the active waveguide of the semiconductor laser or optical amplifier. The top and bottom electrodes may comprise one or more conductive layers (e.g., metallic layers). In some implementations, the top and the bottom electrodes may be both segmented. In some cases, the segmented top and bottom electrodes may have the same number of segments such that a pair of longitudinal segments comprising a top longitudinal segment and a bottom longitudinal segment control the current injected to the same region of the gain layer. In some such cases, the electronic system/electronics may individually control the voltage applied (and therefore current following) between a longitudinal segment of the top electrode and the respective longitudinal segment of the bottom electrode.

In some cases, the proposed configurations disclosed herein may enable controlling the longitudinal injection current distribution along the waveguide of an optical amplifier or the cavity of a semiconductor laser using a submount comprising a plurality of conductive pads (e.g., metallic pads) configured to be electrically connected to different regions or different segments of an electrode disposed above or below the gain layer of a semiconductor laser or optical amplifier. In some cases, the electrode (e.g., the top electrode or the bottom electrode) may be a single element electrode comprising a uniform conductive layer. In some such cases, individual conductive pads may be in electrical contact with different regions or areas of the electrode that are located at a distance from each other, e.g., at least in the longitudinal direction. For example, a first region or area of the electrode extends from a first end to a second end along the length of the electrode and a second region or area of the same electrode (different from the first area) may extend from a third end to a fourth end along the length of the electrode such that a longitudinal distance between the first end and the front reflector is smaller than a longitudinal distance between the third end and the front reflector. The first region or area, for example, could be closer to the front reflector (or the output port) than the second region and the second region or area can closer to the back reflector (or the input port) than the first region or area. In some examples, the current and/or voltage provided to individual conductive pads may be controlled (e.g., by an electronic control system or control electronics), to provide different currents and/or voltages thereto, and may in various implementations thereby tailor a distribution of the current and/or current densities injected to longitudinal regions of a gain layer below the respective electrode regions. Such control over the longitudinal injection current profile may, in some cases, be used to mitigate longitudinal current crowding in the laser cavity and possibly its impact on the efficiency of the laser light generation by the active waveguide.

In some implementations, the longitudinal current distribution along the laser cavity (e.g., in the gain layer), may be further tailored by tailoring a current control layer between an electrode of the laser and the gain layer. For example, a current control layer may be tailored to provide electrical isolation between regions of the semiconductor laser below longitudinal electrode segments and/or below electrode regions in contact with different conductive pads.

In some cases, a longitudinal injection current distribution along an amplifier waveguide or a laser cavity may be tailored using a longitudinally segmented top electrode, a longitudinally segmented bottom electrode, longitudinally segmented top and bottom electrodes, uniform top and/or bottom electrode where the top and/or the bottom electrode are in electrical contact with multiple conductive pads of a submount or any combination of these. An electronic control system or control electronics may individually control the currents and/or voltages provided to individual longitudinal segments or conductive pads, for example, possibly to generate a longitudinal injection current distribution in the gain layer that can be more uniform than a longitudinal injection current distribution that may be generated by providing a longitudinally uniform voltage along the amplifier waveguide or laser cavity.

In some examples, the current and/or voltage provided to individual conductive pads may be controlled (e.g., by an electronic control system or control electronics), to provide different currents and/or voltages to an active waveguide of a laser or an amplifier, to increase an output power generated by the laser or the optical amplifier (e.g., by mitigating current crowding effect).

FIG. 1A illustrates a top cross-sectional view of an example semiconductor laser 100. In some cases, the semiconductor laser 100 can be a broad area laser. In some cases, the semiconductor laser 100 can be a Fabry-Perot laser. The semiconductor laser 100 may comprise a substrate 108, a front optical reflector 102, a back optical reflector 104, an active waveguide 106 extended in a longitudinal direction (e.g., parallel to the z-axis shown in FIG. 1A) between the front optical reflector 102 and the back optical reflector 104. In some cases, the active waveguide 106 can be a ridge waveguide. In some cases, the active waveguide can be a buried waveguide. In some other cases, the active waveguide 106 can be a slab waveguide having width in the lateral direction (parallel to x-axis) substantially equal to the width of the substrate 108. The front optical reflector 102 and the back optical reflector 104 may form a laser cavity that recirculates laser light generated and amplified by the active waveguide 106. In some cases, the laser light may comprise light having wavelengths within at least one bandwidth centered at or around a center laser wavelength. In some cases, the laser light may comprise light having wavelengths within multiple bandwidths centered at or around respective center laser wavelengths. The active waveguide 106 may include a gain layer that, when activated (e.g., electrically pumped), generates and amplifies laser light inside the laser cavity. In some cases, the front and the back reflectors 102, 104 can be cleaved facets. In some such cases, a cleaved facet may be coated with a metal layer or one or more dielectric layers. In some cases, the back reflector 104 can have high reflectivity within a wavelength range that comprises the wavelengths included in the laser light or within a gain bandwidth of the gain layer. In some cases, the reflectivity of the front reflector 102 can be lower than the reflectivity of the back reflector 104 for the wavelengths included in the laser light or within the gain bandwidth of the gain layer. In various implementations, the front and/or the back reflectors may comprise a distributed Bragg reflector (DBR), a sampled grating Bragg reflector (SGDBR), a cleaved facet, or a cleaved facet having a reflective coating. In some cases, the front reflector may comprise a cleaved facet having an anti-reflection (AR) coating.

In some cases, the structure shown in FIG. 1A may comprise a semiconductor optical amplifier. In some such cases, the back optical reflector 104 may comprise a low reflectivity rear facet serving as the input port of the optical amplifier and the front reflector 102 may comprise another low reflectivity facet serving as the output port of the optical amplifier. In various implementations, a low reflectivity facet may comprise a cleaved facet or a cleaved facet having an AR coating.

In some examples, the reflectivity of the back reflector can be from 50% to 80%, 80% to 95%, 95% to 97%, from 97% to 99%, from 99% to 99.9%%, from 99.9% to 99.99%, from 99.99% to 99.999% or any range formed by any of these values or large or smaller. In some examples the reflectivity of the front reflector can be from 0% to 1%, 1% to 5%, 5% to 15%, 15% to the 50%, from 50% to 90% or any range formed by any of these values or large or smaller.

In some examples, the reflectivity of the input port or the output port of an optical amplifier can be from 0% to 0.001%, 0.001% to 1% to 5%, 5% to 10%, 10% to 15%, from 15% to 20%, or any range formed by any of these values or large or smaller.

The active waveguide 106 may have a length (referred to as "waveguide length") along the longitudinal direction (e.g., parallel to the z-axis), a width (referred to as "waveguide width") along a lateral direction (e.g., parallel to the x-axis) that is perpendicular to the longitudinal direction and a thickness (referred to as "thickness") along a vertical direction perpendicular to the longitudinal and lateral directions (e.g., parallel to z-axis). In some cases, the waveguide length may be substantially equal to a distance between the front 102 and back 104 reflectors. In some cases, the gain layer may be extended along the entire waveguide length. In some other cases, the gain layer may be extended along a longitudinal portion of active waveguide 106 less than the full length of the waveguide. In some cases, the active waveguide 106 may confine laser light or amplified light in a vertical direction perpendicular to the top surface of the substrate. In some such cases, a lateral confinement of the laser light generated by the semiconductor laser 100 (or light amplified by an optical amplifier) may be provided by a guiding structure (e.g., a ridge) above the active waveguide 106. In some cases, the active waveguide 106 may confine the laser light generated by the semiconductor laser 100 (or light amplified by an optical amplifier) both in the vertical and lateral directions. In some cases, the laser light (or amplified light) inside the waveguide 106 may be laterally confined by the refractive index change induced by the injected current via thermal lensing effect.

In some cases, a top electrode may be disposed above the active waveguide 106 and a bottom electrode may be disposed below the active waveguide 106. For example, in various designs, the top electrode may be disposed on a top layer of the laser (or amplifier) 100 and the bottom electrode may be disposed on a bottom surface of the substrate 108. In some cases, the top and the bottom electrodes can be metallic layers comprising gold, copper, silver, or other metals or an alloy composed on any combination of these or other metals. In some cases, the top and the bottom electrodes may comprise a highly conductive alloy or material.

In some cases, current can be injected to a region 107 of the active waveguide 106 to pump or optically activate by applying a voltage difference between the top electrode and the bottom electrode. In some examples, the bottom electrode may be electrically connected to a ground potential and a voltage (with respect to the ground potential) may be applied on the top electrode. In some examples, the pumped region 107 (e.g., the region that receives injection current), may be a region of the active waveguide 106 determined by the top electrode and the active waveguide 106. In some examples, the pumped region 107, maybe a region of the active waveguide determined by a high conductivity layer positioned between the top electrode and the active waveguide. In some examples, the pumped region 107, may be a region of the active waveguide determined by a dielectric layer positioned between the top electrode and the active waveguide 106. The pumped region 107 may have a width in the lateral direction (parallel to x-axis), a thickness along a vertical direction (perpendicular to the top surface of the substrate 108), and a length along the longitudinal direction (parallel to z-axis). The length of the pumped region 107 may be equal or smaller than the distance between the front 102 and the back 104 reflectors. In some cases, the thickness of the pumped region 107 may be substantially equal to the waveguide thickness. In some cases, a width of the pumped region 107 may be substantially equal to the width of the active waveguide. In some other cases, a width of the pumped region 107 may be smaller than the width of the active waveguide.

FIG. 1B illustrates a top view of the semiconductor laser (or optical amplifier) 100 with a top electrode 110 disposed above the active waveguide 106. In the example shown, the top electrode 110 has a rectangular shape longitudinally extending along the active waveguide from a first end near or closer to the front reflector 102 to a second end near or closer to the back reflector 104. The top electrode 110 may have a width along a lateral direction (e.g., along x-axis) and a length along the longitudinal direction (e.g., along z-axis). In some cases, the width of the top electrode 110 may be larger than the width of the active waveguide 106. In some cases, the width of the top electrode 110 may be larger than the width of the pumped region 107. In some cases, the length of the top electrode 110 can be smaller than or equal to the waveguide length. In some cases, a single element rectangular top electrode 110 may be used to apply a longitudinally uniform voltage or bias on the active waveguide (to the gain layer within the active waveguide). In the example shown, a patterned dielectric layer between the top electrode 110 and the active waveguide 106 may laterally limit the current injected to the active waveguide; as such, the width of the pumped region 107 can be smaller than the width of the top electrode 110.

Figure 2A:
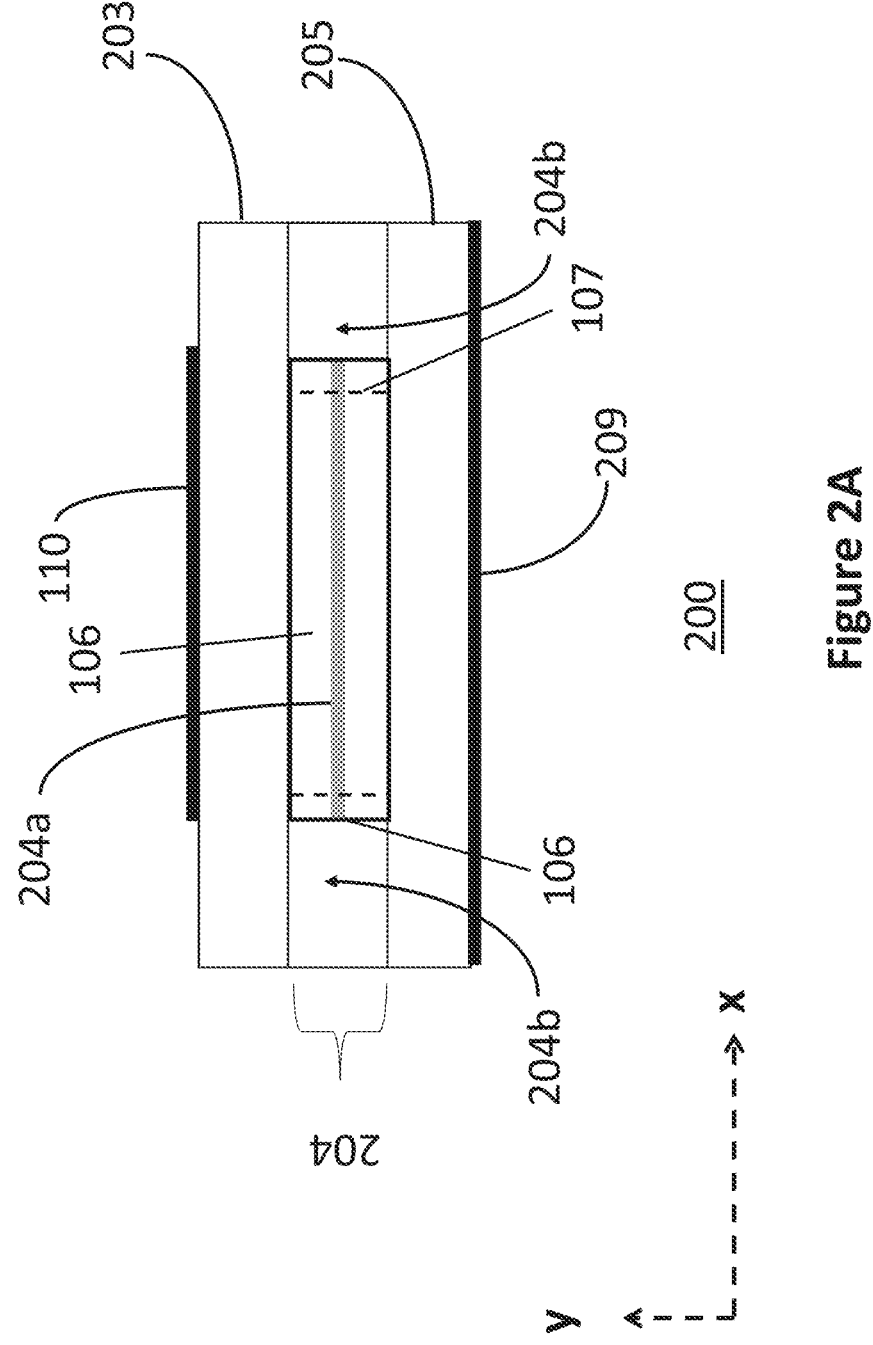
FIG. 2A illustrates side cross-sectional view of an example semiconductor laser (or optical amplifier) shown in FIG. 1A depicting different layers of the semiconductor laser (or optical amplifier).

FIG. 2A shows an example vertical cross-section (e.g., cross-section through a plane orthogonal to length of the active waveguide or parallel to x-y plane) of a semiconductor laser or semiconductor amplifier 200 having a buried active waveguide 106. In some cases, the vertical direction (y-axis) may be the growth direction of the active waveguide 106. In some cases, the vertical cross-section shown in FIG. 2A can be a vertical cross-section of the semiconductor laser 100. In the example shown, the semiconductor laser or optical amplifier comprises: a top electrode 110, a top layer 203, a middle layer 204, a bottom layer 205, and a bottom electrode 209. The middle layer 204 may comprise the active waveguide 106, and two dielectric sections 204b. In some cases, an optical refractive index of waveguide 106 may be larger than the refractive index of the top layer 203, bottom layer 205, and the dielectric sections 204b. In some such cases, laser light (or amplified liht) may be vertically and laterally confined by the waveguide 106. The waveguide 106 may include the gain layer 204a or otherwise have gain material included in the waveguide. In some cases, one or more of the top layer 203, the middle layer 204 and/or the bottom layer 205 may comprise multiple sublayers. In some cases, the gain layer 204a may comprise one or more quantum well sublayers configured to provide optical gain upon being pumped by a current. In some cases, the gain layer 204a may include one or more quantum wire sublayers or quantum dot sublayers. In various designed, a thickness and refractive index of the sublayers of the middle layer 204 may be tailored to increase the overlap between the guided optical wave and the gain layer.

Figure 2B:
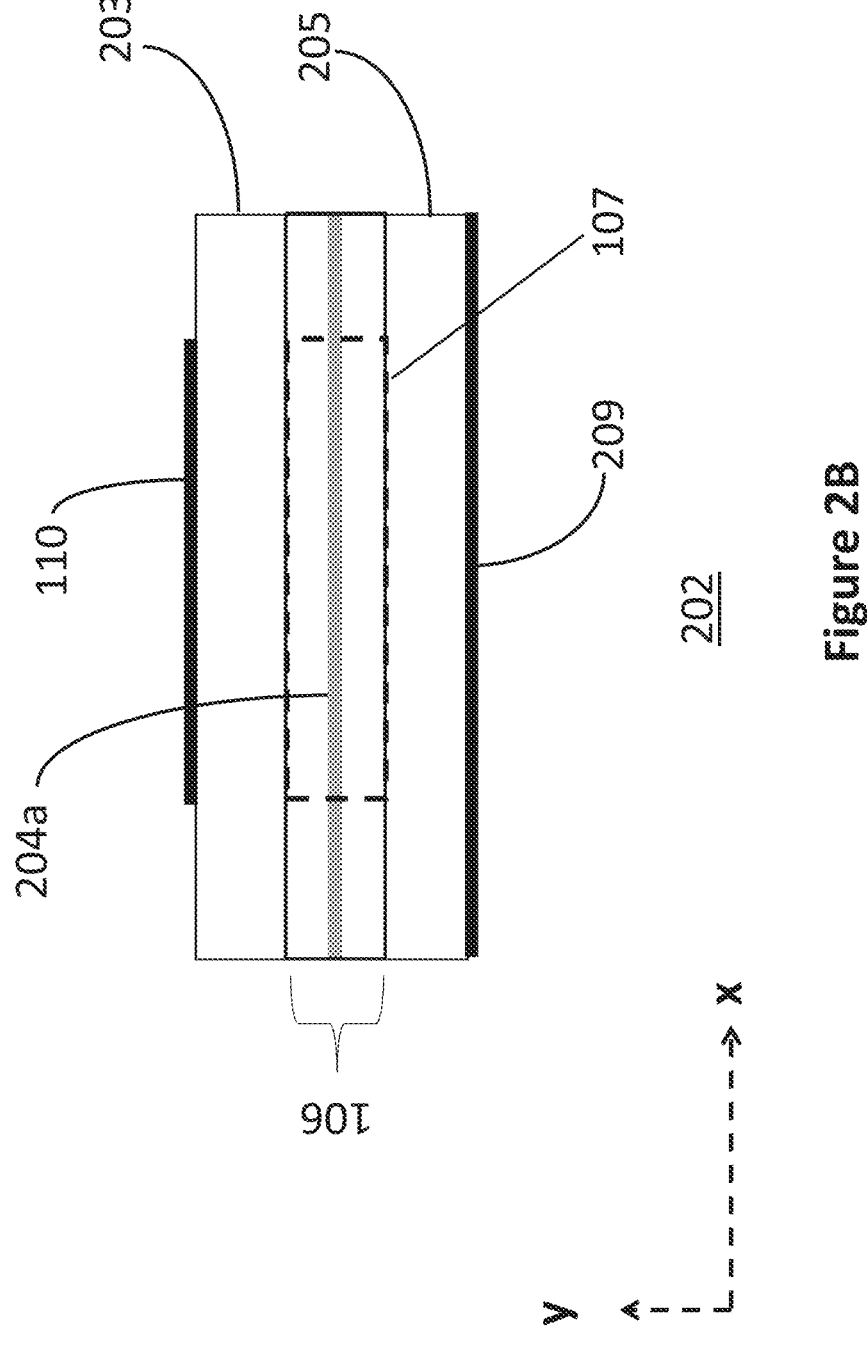
FIG. 2B illustrates side cross-sectional view of another example of a semiconductor laser (or optical amplifier) shown in FIG. 1A depicting different layers of the semiconductor laser (or optical amplifier).

FIG. 2B shows an example vertical cross-section (e.g., cross-section through a plane orthogonal to length of waveguide or parallel to x-y plane) of a broad area semiconductor laser 202. In some cases, the semiconductor laser 202 may comprise one or more of the features described above with the respect the semiconductor laser or optical amplifier 200. In some cases, the vertical cross-section shown in FIG. 2B can be a vertical cross-section to the semiconductor laser 100. In the example shown, the semiconductor laser comprises: a top electrode 110, a top layer 203, an active waveguide 206, a bottom layer 205, and a bottom electrode 209. In some cases, an optical refractive index of active waveguide 106 may be larger than the refractive index of the top layer 203, and the bottom layer 205. In some such cases, laser light may be vertically (parallel to y-axis) confined by the waveguide 106. The waveguide 106 may include the gain layer 204a or otherwise have gain material included in the waveguide. In some cases, one or more of the top layer 203, the active waveguide 106, and/or the bottom layer 205 may comprise multiple sublayers. In some cases, a region of the top layer 203 may be etched to laterally confine the laser light propagating in the waveguide 106. In some cases, the top layer 203 may include one or more lateral sections configured to confine the laser light propagating in the waveguide 106 in the lateral direction. For example, the top layer 203 may include a high index section between two low index regions.

In some cases, a width of the pumped region 107 of the active waveguide 106 of the semiconductor laser or optical amplifier 200 or the semiconductor laser 202, may be substantially equal to a width of a low resistivity section (e.g., comprising a highly doped p-type semiconductor), of the top layer 203. In some other cases, a width of the pumped region 107 of the active waveguide 106 of the semiconductor laser or optical amplifier 200 or the semiconductor laser 202, may be substantially equal to a width of the top electrode 110. In some case, the width if the top electrode 110 can be larger than the waveguide width and/or the width of the pumped region 107.

In some examples, the bottom layer 205 of the semiconductor laser or optical amplifier 200 may comprise the substrate 108 of the laser of optical amplifier 100.

In some examples, the top electrode 110 may be disposed on the top layer 203 (e.g., top surface of the top layer 203) and the bottom electrode 209 may be disposed on the bottom layer (e.g., bottom surface of the bottom layer 205). In some such examples, the top layer may comprise a highly doped semiconductor material (e.g., a p-type material). Other configurations, however, are possible. For example, one or more intermediate layers or sublayers may be included between the electrode and the top layer 203 and bottom layer 205, respectively. In some cases, the width of the top electrode 110 may be larger than that width of the active waveguide. In some cases, the pumped region 107 of the active waveguide 106 may have a thickness that is substantially equal or smaller than the waveguide thickness. In some cases, the pumped region 107 of the active waveguide 106 may have a width that is substantially equal or smaller than the waveguide width.

In certain implementations, the bottom electrode 209 may be an electrically conductive layer in electrical contact with the bottom layer 205 and the top electrode 110 may be another electrically conductive layer in electrical contact with the top layer 203. In some examples, the top 110 and/or bottom 209 electrodes may comprise metal. In some examples, the top 110 and/or bottom 209 electrodes may comprise one or more materials selected from the group:

aluminum, gold, copper, tin, germanium, titanium, platinum, nickel, or any conductive alloy of these and other materials. Other materials may also be used. A thickness of any of the electrically conductive layers may be from 0.001 to 0.1 microns, 0.1 to 1 microns, from 1 to 2 microns, from 2 to 4 microns, from 4 to 6 microns, from 6 to 20 microns, or any range formed by any of these values or large or smaller.

A voltage difference between the top 110 and the bottom 209 electrode, or a voltage applied on the top electrode 110 when the bottom electrode 209 is grounded or vice versa, may generate a current distribution within the gain layer 204a. An active region of the gain layer 204a that is activated by the current, may provide optical gain to at least a portion of the laser light that partially overlaps with the gain layer as the laser light wave propagates in the active waveguide 106 (e.g., along a direction parallel to the z-axis).

In some cases, a current control layer may be included as a sublayer between the top electrode 110 and the gain layer 204a. The current control layer may have low resistivity (e.g., a highly doped semiconductor layer) or high resistivity (e.g., a dielectric layer) or be somewhere in between (e.g., a doped semiconductor layer). Ion implanting of semiconductor may also be used to increase resistivity and/or reduce conductance. In some cases, a high resistivity current control layer may be patterned to isolate current flow across different regions of the gain layer 204a. For example, a current control layer can be an ion implanted layer where high resistivity ion implanted semiconductor regions divide the current control layer into electrically isolated regions. In some cases, the electrically isolated regions of a current control layer may facilitate control (possibly independent control) over current injected to different regions of the gain layer. Different current levels may thereby be injected into different locations of the gain layer 204a as a result of the current control layer.

A spatial distribution of the current in the gain layer 204a may be referred to herein as the "injection current profile". Accordingly, a lateral distribution of injected current in the gain layer (along the waveguide width, e.g., parallel to the x-axis) may be referred to herein as the "lateral injection current profile" and a longitudinal distribution of injected current in the gain layer (along the length of the waveguide, e.g., parallel to the z-axis) may be referred to herein as the "longitudinal injection current profile".

In some cases, the top layer 203, the middle layer 204 and/or the bottom layer 205 may comprise semiconductor materials. In some cases, the top layer 203, the middle layer 204 and/or the bottom layer 205 may comprise doped semiconductor material (e.g., p-type or n-type doped semiconductor material). The sublayers in each layer may comprise different types of semiconductor materials and may have different doping levels. In some cases, the top layer 203 may comprises a highly doped semiconductor layer (e.g., p-type semiconductor layer) in contact with the top electrode 110.

In various implementations, materials used in the semiconductor laser or optical amplifier and the layers therein comprise III-V semiconductor materials. In some implementations, the top layer 203, the middle layer 204 or the bottom layer 205 can include one or more materials selected from the group: gallium arsenide (GaAs), indium phosphide (InP), sapphire, silicon, gallium antimonide (GaSb), or gallium nitride (GaN). In some cases, the layers or the sublayers may include binary, ternary, quaternary, and quinternary alloys formed from one or more of the following: Ga, As, In, P, N, Al, Sb. Other material, however, may be used.

The gain layer 204a can comprise one or more materials selected from the group: gallium arsenide (GaAs), Indium Gallium Arsenide (InGaAs), indium phosphide (InP), Aluminum Indium Arsenide (AlInAs), indium gallium arsenide phosphide (InGaAsP), any ternary from InGaAsP, aluminum gallium arsenide (AlGaAs), indium aluminum gallium arsenide (InAlGaAs), indium aluminum phosphide (InAlP), indium aluminum gallium arsenide phosphide (InAlGaAsP) or any other ternary, quaternary, or quinternary compound. However, other material may be used in different implementations.

In some cases, the gain layer 204a may comprise one or more quantum-well sub-layers. In some cases, the quantum-well sub-layers may be configured to support quantum cascade amplification. In some cases, the gain layer 204a may comprise one or more quantum-dot sub-layers or quantum wire sublayers.

The bottom layer 205 can comprise one or more materials selected from the group: gallium arsenide (GaAs), indium phosphide (InP), sapphire, silicon, or gallium nitride (GaN) although other material may be used.

In various implementations, a thickness of the top layer (in vertical direction) may be from 0.001 to 0.1 micrometers (microns), from 0.1 to 1 microns, from 1 to 2 microns, from 2 to 4 microns, or from 4 to 20 microns or any range formed by any of these values or large or smaller.

A thickness of the gain layer (in vertical direction) may be from 0.001 to 0.1 microns, from 0.1 to 1 microns, from 1 to 2 microns, from 2 to 4 microns, or from 4 to 20 microns or any range formed by any of these values or large or smaller.

A thickness of the bottom layer (in vertical direction) may be from 0.001 to 0.1 microns, from 0.1 to 1 microns, from 1 to 2 microns, from 2 to 4 microns, or from 4 to 20 microns or any range formed by any of these values or large or smaller. Other sizes, however, are possible.

In various implementations, the material and/or composition of any of the sublayers may be selected based on the input wavelength or a target laser wavelength generated in the active waveguide 105. In some cases, the gain layer 204a may be composed of: GaN based material (e.g., compounds), GaAs based material, InP based material, GaSb based material, and InP based material. In some such cases, the gain layer may amplify light having wavelength from 300 nm to 550 nm, from 600 nm to 1200 nm, from 1200 nm to 2100 nm, from 2100 nm to 3500 nm, from 2100 nm to 8000 nm, or any other wavelength range formed by any of these values or may be outside these ranges.

In some example designs, the top electrode 110 may be connected to a current source and the bottom electrode 209 may be connected to a ground potential to support current injection to the gain layer 204a resulting in activation of at least a region (e.g., a region containing quantum wells, quantum wires or quantum dots) of the gain layer 204a although other configurations are possible. A magnitude and a spatial distribution of current injected into the gain layer 204a may be controlled based at least in part on one or more of the following factors: the electrical properties of: the top layer 203, gain layer 204a, and/or bottom layer 205, a shape of the top electrode 110, a shape of the bottom electrode 209, a shape of a current control layer, location of the conductive lines or wires that provide voltage and/or current to the top or bottom electrodes, or current and/or voltages provided to different segments (e.g., electrically isolated segments) of the top or bottom electrodes.

In some cases, a semiconductor optical amplifier may comprise one or more features described above with respect to FIG. 2B and the broad area semiconductor laser 202.

Figure 3A:
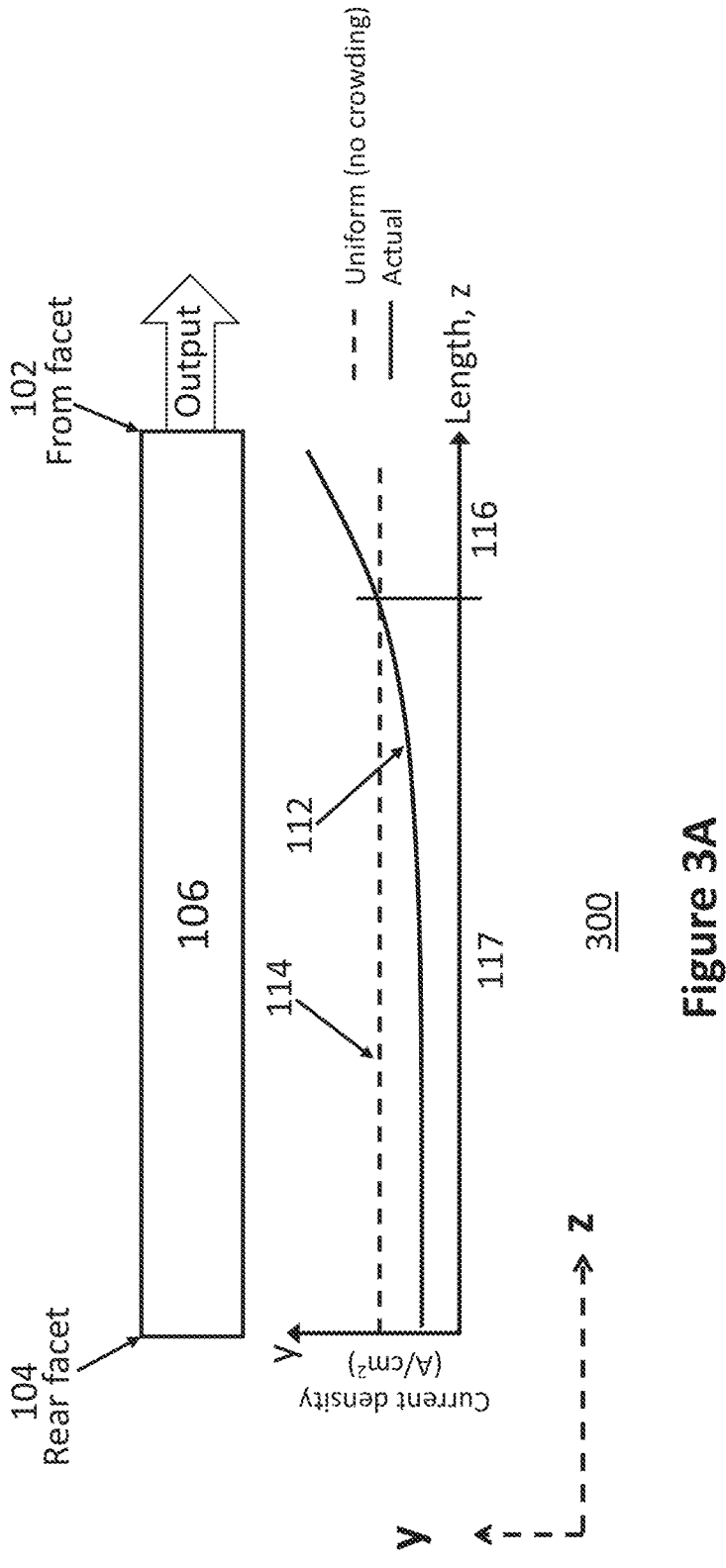
FIG. 3A illustrates a side-view cross-section of the active waveguide and the distribution of current density along the length of the active waveguide for a semiconductor laser similar to the semiconductor laser shown in FIG. 1A.

FIG. 3A illustrates a side-view of the active waveguide 106 and a schematic plot 300 showing calculated current density distributions 300 along the longitudinal direction of the laser cavity formed between the front reflector 102 and the back reflector 104 (e.g., parallel to the z-axis). In some examples, the calculated current density distribution 112 (solid line) may represent the longitudinal distribution of injection current density generated by applying a longitudinally uniform voltage on the active waveguide from the first reflector 102 to the second reflector 104 (e.g., using a single element top electrode similar to the single element top electrode 110). The current density distribution 112 (solid line) indicates that upon uniform electrical activation, the injection current density decreases (e.g., monotonically decrease) in the longitudinal direction from the front reflector 102 toward the back reflector 104 (e.g., along z-axis). A rate of change of the injection current density is larger near the front reflector 102 (e.g., close to an exponential decay rate) and gradually drops toward the back reflector 104 (e.g., close or a linear decay).

In some cases, when calculating the distribution of the injection current density along the laser cavity, the electronic properties of the active waveguide 106 (e.g., carrier recombination rate) can be decoupled from the intensity of laser light interacting with the active waveguide 106. In such cases, the calculated distribution of the injection current density along the laser cavity may become uniform or near uniform (e.g., the injection current density may stay substantially constant along z-axis). The current density distribution 114 (dashed line) is an example of such current distribution. In some cases, the parameter values used to calculate the current density distribution 112 and 114 may be identical except that for the uniform current distribution 114, the electrical properties of the gain layer may be decoupled or independent from the intensity of laser light circulating inside the laser cavity. A comparison between the current density distributions 114 and 112 indicates that the interaction of laser light, that is nonuniformly distributed along the waveguide 106, increases the current density within a first longitudinal section 116 of the active waveguide 106 and decreases the current density within a second longitudinal section 117 of the active waveguide. As described above, such nonuniform distribution of injection current density along the laser cavity, known as current crowding, may reduce the efficiency (e.g., slope efficiency) of the semiconductor laser or the efficiency of a semiconductor optical amplifier, in particular, when high current levels are provided to the laser to generate high power laser outputs.

Advantageously, as discussed herein, the injection current profile in the active waveguide 106 may be controlled by dividing the top electrode 110 and/or the bottom electrode 209 into two or more electrically isolated segments, and individually controlling the voltage and/or current provided to an individual electrode segment. In some implementations, a segmented top or bottom electrode may be disposed on the P-side of a semiconductor laser or optical amplifier. In some implementations, a segmented top or bottom electrode may be disposed on the N-side of a semiconductor laser or optical amplifier. Additionally, as discussed herein, the injection current profile in the active waveguide 106 may be controlled by controlling the voltage and/or current provided to different regions of a non-segment top or bottom electrode.

In some cases, the top or the bottom electrode may be longitudinally segmented along the laser cavity (e.g., parallel to the z-axis) or the optical amplifier to control the longitudinal injection current profile in the active waveguide 106 and the gain layer 204a. In some such cases, the voltage and/or current provided to individual longitudinal electrode segments may be controlled to generate a uniform or more uniform longitudinal injection current profile within the gain layer 204a along the length of the laser cavity or the optical amplifier. In some such cases, the voltage and/or current provided to individual longitudinal electrode segments may be controlled to generate a more uniform longitudinal injection current profile within the gain layer 204a along the length of the laser cavity or the optical amplifier, compared to an injection current profile generated by a non-segmented electrode.

In some cases, the voltage and/or current provided to individual longitudinal electrode segments may be controlled to increase efficiency or slope efficiency of the semiconductor laser or the optical amplifier.

In some cases, the voltage and/or current provided to individual longitudinal electrode segments may be controlled to increase the optical power of laser light output by a semiconductor laser (e.g., via the front reflector) or amplified light output by a semiconductor optical amplifier (e.g., via the output port).

In some implementation, a longitudinally segmented top or bottom electrode may allow generation of a user-defined injection current profile along the laser cavity and an optical amplifier. For example, more current can be applied to longitudinal sections of the gain layer 204a having higher efficiencies and less current may be applied to longitudinal sections of the gain layer 204a having lower efficiency. In some cases, the higher or lower efficiency of a longitudinal section of the gain layer 204a may be associated with the intensity of laser light (or amplified light) propagating within the longitudinal section. As discussed above, these longitudinal sections have different locations along the longitudinal axis (e.g., along the direction parallel to the z-axis), along the length of the laser cavity, or along the length of an amplifier waveguide.

A user defined injection current profile or a more uniform injection current profile may improve the efficiency of the semiconductor laser or optical amplifier and/or the level of optical power generated by the semiconductor laser or the optical amplifier, compared to that generated or amplified in a semiconductor laser or optical amplifier comprising a single element top electrode and/or a single element bottom electrode.

In some implementations, an electronic control system or control electronics may independently control the currents provided to the individual longitudinal electrode segments. For example, the electronic control system or control electronics may comprise a power supply or current source configured to apply individually controlled voltages using individual longitudinal segments to provide a set, desired or target current to an individual longitudinal electrode segment. The value of the set, desired or target current for an individual longitudinal electrode segment may be a user selected current or a value determined by a controller of the electronic control system. In some cases, the controller of the control electronics may determine the value of the set or target current based at least in part on a measured parameter of the semiconductor laser (e.g., an output power) that is controlled by the electronic control system or control electronics.

In some implementations, the current provided to an individual longitudinal section of the gain layer 204a may be dynamically controlled during the operation of the laser to generate a desired or target longitudinal current profile (e.g., a more uniform longitudinal current profile) based at least in part on a laser output power. For example, the voltages and current applied using individual longitudinal electrode segments may be selected to provide a first longitudinal injection current profile below and near a lasing threshold and dynamically adjusted to provide a second longitudinal injection current profile above the lasing threshold. In some cases, the transition from the first to the second longitudinal injection current profile can be a gradual and smooth transition. In some other cases, the transition may be a stepwise transition. In some examples, the power of laser light circulating inside the cavity may be assessed by a photodetector. For example, in some examples, the power of laser light output from the front reflector 102 may be measured by a photodetector that generates a corresponding detected voltage, which may be proportional to the measured power. In some examples, the power of amplified light propagating inside an optical amplifier may be assess by a photodetector, for example, configured to measure output from its output port. The photodetector may output a signal indicative of the measured optical power that may be used as a feedback signal to control one or more power supplies that provide voltage and/or current to longitudinal electrode segments. Other feedback and/or arrangements for controlling the voltage and/or current are possible. In some implementations the photodetector may receive light from the front reflector of the laser or the output port of the amplifier.

In some implementations, the electronic control system of a semiconductor laser (or optical amplifier) may provide individually controlled currents and voltages to the individual longitudinal segments of a segmented electrode of the semiconductor laser (or optical amplifier) based at least in part on the signal received from the photodetector. In some such cases, the voltage and/or current provided to individual longitudinal electrode segments may be controlled to increase efficiency or slope efficiency of the semiconductor laser or the optical amplifier or to increase the optical power of laser light (or amplified light) output by a semiconductor laser (or optical amplifier), via the front reflector (or the output port).

In some cases, a longitudinal electrode segment may have a length along the longitudinal direction, e.g., along the active waveguide 106 or laser cavity (e.g., parallel to the z-axis) and a width along a lateral direction perpendicular to the longitudinal direction (e.g., parallel to the x-axis). In some cases, individual longitudinal electrode segments may have equal or different lengths and widths. In some cases, individual longitudinal electrode segments may have equal lengths and widths. In some cases, individual longitudinal electrode segments may have equal lengths but different widths. In some cases, individual longitudinal electrode segments may have different lengths but equal widths. In some cases, individual longitudinal electrode segments may have different lengths and different widths. In some implementations, the longitudinal electrode segments may be equally spaced. In some other implementations, the spacing between longitudinal electrode segments may vary along the active waveguide. In some other implementations, the widths of the longitudinal electrode segments may vary along the active waveguide. In some other implementations, an average width or the widths of the longitudinal electrode segments may increase (e.g., linearly or nonlinearly) along the active waveguide from the back reflector (or input port) to the front reflector (or the output port). In some cases, two or more longitudinal electrode segments may have similar shapes. In some such cases, longitudinal electrode segments having similar shapes may be uniform in size. In some other cases, longitudinal electrode segments having similar shapes may be nonuniform in size. In some cases, the number of longitudinal electrode segments can be between 2 and 4, 4 and 6, 6 and 10, 10 and 20, or any in any range formed by any of these values or a number smaller or larger.

In various implementations, a longitudinal electrode segment may comprise a section having a rectangular shape, a diamond shape, a shape having curved lateral edges, a shape having triangular lateral edges, a shape having sawtooth shaped lateral edges, a shape having sinusoidal lateral edges or other shapes.

In some cases, individual longitudinal electrode segments may extend symmetrically in the lateral direction with respect to a centerline of the active waveguide 106.

Figures 3B, 3C:
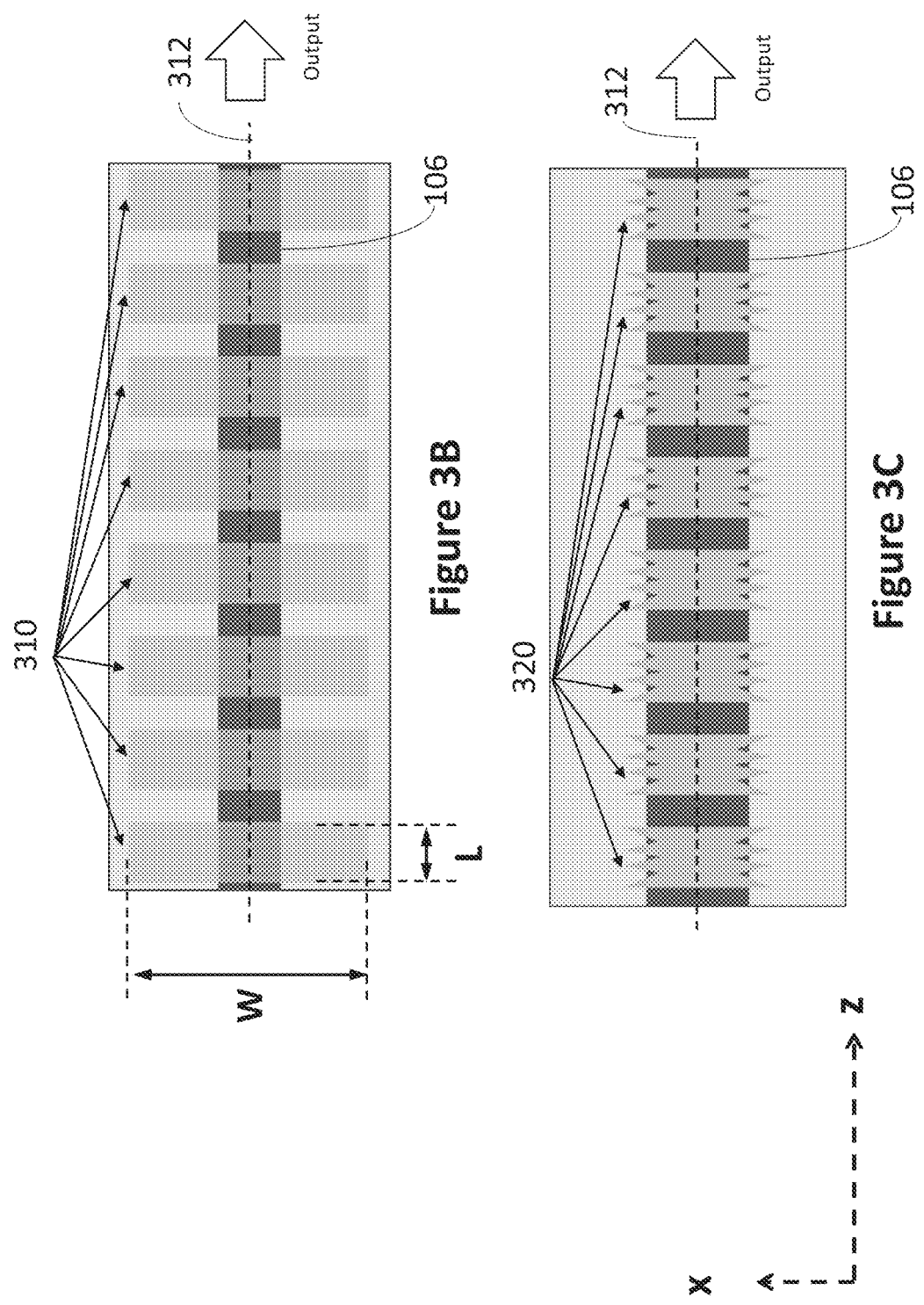
FIG. 3B illustrates a top view of an example of a longitudinally segmented top electrode having rectangular segments (e.g., equally spaced segments) disposed on a semiconductor laser or optical amplifier.
FIG. 3C illustrates a top view of another example of longitudinally segmented top electrode having segments (e.g., equally spaced segments) with triangular (e.g., saw tooth) shape lateral edges, disposed on a semiconductor laser or optical amplifier.

FIG. 3B illustrates a top view of an example of a longitudinally segmented top electrode 310 having equally spaced rectangular longitudinal electrode segments disposed on a semiconductor laser (e.g., semiconductor laser 100). As illustrated, the electrode segments are arranged such that different segments are positioned at different longitudinal positions along the length of the active waveguide, gain medium, and/or laser cavity (e.g., parallel to the z-axis).

In the example shown, the length (L) of an individual segment is smaller than its width (W), different segments have identical lengths and widths, and are equally spaced. In some cases, the width (W) of a segment can be between 0.1 and 1 microns, 1 and 10 microns, 10 and 100 microns, 100 and 1000 microns, or any range formed by any of these values or larger or smaller. In some cases the length (L) of an segment can be between 1 and 10 microns, 10 and 100 microns, 100 and 1000 microns, 1000 and 10000 microns, or any range formed by any of these values or larger or smaller. In some cases a spacing between the individual segments can be between 0.01 and 0.1 microns, 0.1 and 1 microns, 1 and 10 microns, 10 and 100 microns, 100 and 1000 microns, or any range formed by any of these values or larger or smaller.

FIG. 3C illustrates a top view of another example of a longitudinally segmented top electrode 320 having equally spaced longitudinal electrode segments with protrusions, namely triangular-shaped lateral edges in this example, disposed on a semiconductor laser. In the example shown, the width of an individual longitudinal electrode segments increases and decreases multiple times with position along the length of the segment (e.g., parallel to z-axis) forming triangular lateral edges. In some cases, the width of an individual longitudinal electrode segment (parallel to x-axis may increase and decrease multiple times with position along the length such that at least one lateral edge of the segment is triangular (e.g., sawtooth) shaped. In some examples, one lateral edge of a segment may have a triangular (e.g., sawtooth) shape and the other lateral edge may be straight (e.g., parallel to the active waveguide or z-axis).

In various implementations, a triangular (e.g., sawtooth) shape lateral edge of a longitudinal electrode segment may comprise equilateral or right triangles or equilateral triangles. Other uniform or non-uniform shapes are possible. In some cases, a triangular (e.g., sawtooth) shape lateral edge of a longitudinal electrode segment can may comprise 1, 2, 3, 4, 5, or 10 triangles or lateral protrusions having other shapes.

In some cases, the width of an individual longitudinal electrode segment may increase and decrease multiple times with position along the length such that at least one lateral edge of the segment comprises a nonlinear shape (e.g., a sinusoidal shape, a parabolic shape and the like).

In some cases, a lateral edge of an individual longitudinal electrode segment having a width that increases and decreases multiple times along the longitudinal direction, may provide an injection current distribution to the gain layer having an average width equal to the average width of the longitudinal electrode segment.

The individual longitudinal segments of the longitudinally segmented electrode 310 and 320 extend symmetrically in the lateral direction (e.g., along x-axis) with respect to a centerline 312 of the active waveguide 106 such that respective portions of the segment on each side of the centerline are mirror images of each other with respect to the centerline 312. In some cases, an individual longitudinal electrode segment are not symmetric and may be positioned asymmetrically with respect to the centerline of the active waveguide.

In some implementations, in addition to longitudinal segments, a segmented top or bottom electrode may comprise electrically isolated lateral segments. Such electrode segments may be arranged such that different segments are positioned at different lateral positions along the width of the waveguide, gain medium, and/or laser cavity (e.g., parallel to the x-axis). In some cases, lateral segmentation of the top or the bottom electrode may allow controlling a lateral distribution of the injection current density in the gain layer and the active waveguide. In some implementations, this additional degree of freedom may be used to further improve the performance of the semiconductor laser. For example, lateral segmentation of the top or the bottom electrode may be used to control a lateral (or transverse) mode profile of the laser light sustained and output by the semiconductor laser.

In some cases, a lateral electrode segment may have a length along the longitudinal direction, e.g., along the active waveguide 106 or laser cavity (e.g., parallel to the z-axis), and a width along the lateral direction (e.g., parallel to the x-axis). In some such cases, lateral electrode segments may have equal or different lengths and widths. In some cases, lateral electrode segments may have equal lengths and widths. In some cases, lateral electrode segments may have equal lengths but different widths. In some cases, lateral electrode segments may have different lengths but equal widths. In some cases, lateral electrode segments may have different lengths and different widths. In some implementations, individual lateral segments of a longitudinal electrode segment may be equally spaced in the lateral direction. In some other implementations, the spacing between lateral segments of a longitudinal electrode segment may vary along the lateral direction. In some cases, two or more individual lateral segments of a longitudinal electrode segment may have similar shapes. In some such cases, lateral segments of a longitudinal electrode segment having similar shapes may be uniform in size. In some other cases, lateral segments of a longitudinal electrode segment having similar shapes may be nonuniform in size. In some cases, the number of lateral segments of a longitudinal electrode segment can be between 2 and 4, 4 and 6, 6 and 10, 10 and 20, or a number in any range formed by any of these values or a number that is smaller or larger.

In some cases, the lateral segments of a longitudinal segment can be positioned symmetrically in the lateral direction (e.g., along x-axis) with respect to a centerline of the active waveguide 106 such that respective lateral segments and respective portions the lateral segments on each side of the centerline are mirror images of each other with respect to the centerline. In some cases, lateral segments of an individual longitudinal segment may be positioned asymmetrically with respect to the centerline of the active waveguide.

In various implementations, a lateral segment may comprise a section having a rectangular shape, a shape having one or more curved lateral edges, a shape having one or more triangular lateral edges, a shape having one or more sinusoidal lateral edges or other shapes.

Figure 4A:
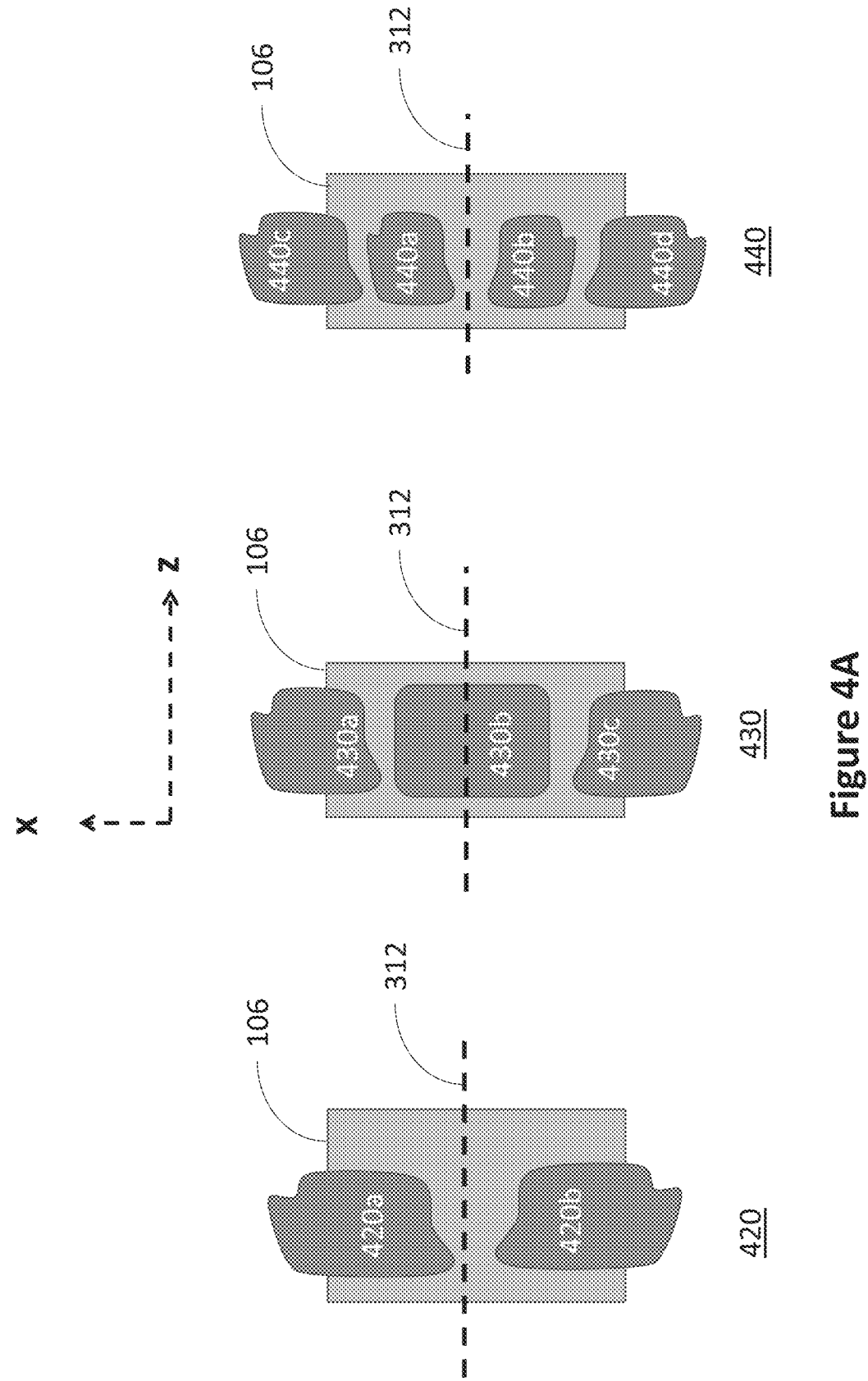
FIG. 4A illustrates top views of examples of laterally segmented longitudinal electrode segments disposed on a semiconductor laser or optical amplifier.

FIG. 4A illustrates top views of examples of laterally segmented longitudinal electrode segments 420/430/440 disposed on an active waveguide 106. As illustrated electrode segments may be arranged such that different segments are positioned at different lateral positions along the width of the waveguide, gain medium, and/or laser cavity (e.g., parallel to the x-axis).

The longitudinal segment 420 comprises two lateral segments 420a/420b that are poisoned symmetrically with respect to the centerline 312. In some cases, the lateral segments 420a/420b may have any shape and they may (or may not) be mirror images of each other with respect to the centerline 312.

The longitudinal segment 430 comprises three lateral segments 430a/430b/430c. The lateral segment 430b has symmetric shape and positioned symmetrically with respect to the centerline 312. The lateral segments 430a/430b may have any shape, and they may (or may not) be mirror images of each other and/or positioned symmetrically with respect to the centerline 312.

The longitudinal segment 440 comprises four lateral segments 434a/440b/440c/440d. The lateral segments 440a/440b may have any shape, and they may (or may not) be mirror images of each other and/or positioned symmetrically with respect to the centerline 312. Similarly, the lateral segments 440c/440d may have any shape, and they may (or may not) be mirror images of each other and/or positioned symmetrically with respect to the centerline 312.

Figures 4B, 4C:
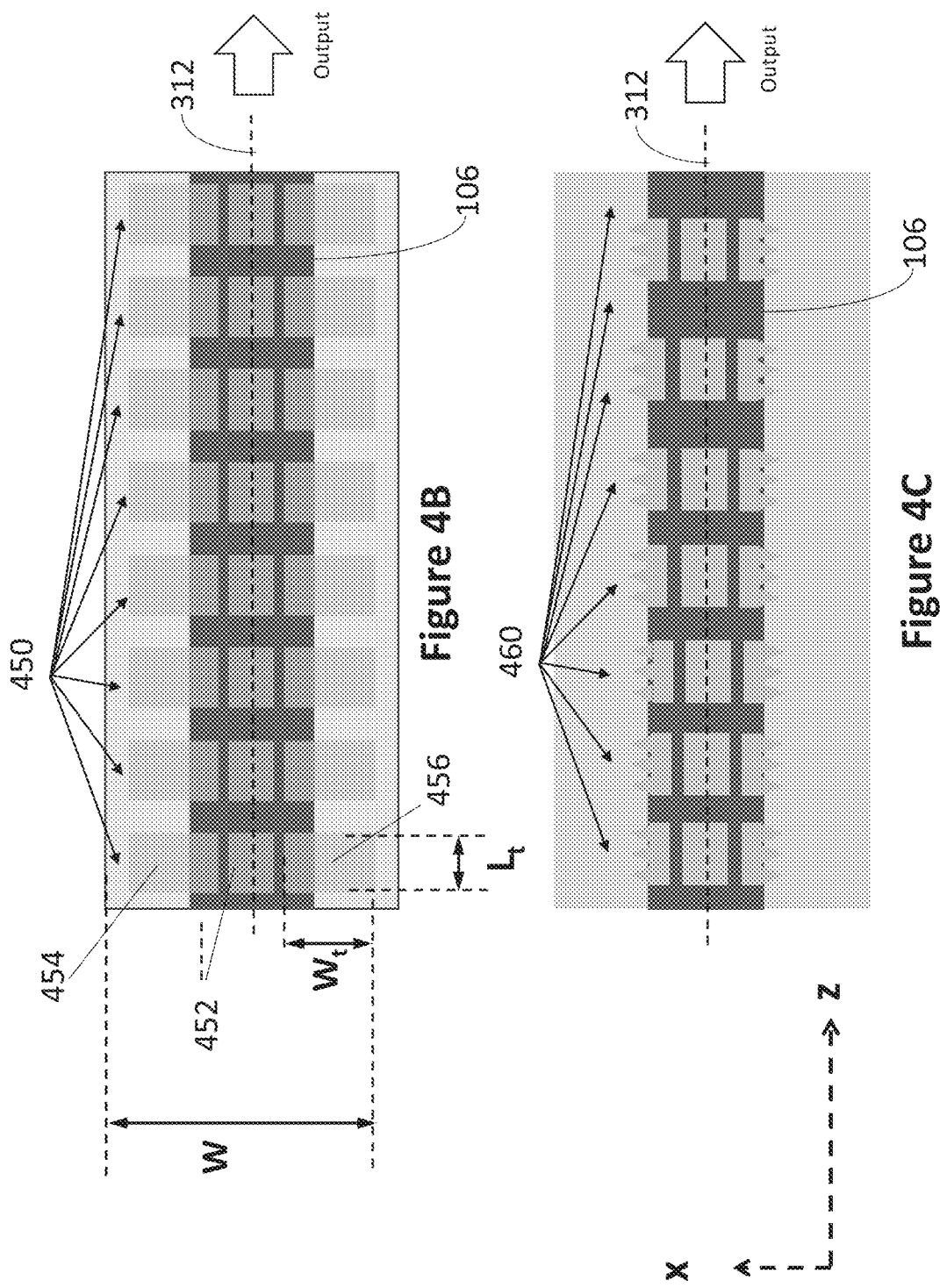
FIG. 4B illustrates a top view of an example of longitudinally and laterally segmented top electrode with segments having rectangular shape lateral and longitudinal segments, disposed on a semiconductor laser or optical amplifier.
FIG. 4C illustrates a top view of another example of longitudinally and laterally segmented top electrode including segments with triangular (e.g., sawtooth) shape lateral edges, disposed on a semiconductor laser or optical amplifier.

FIG. 4B illustrates a top view of an example of longitudinally and laterally segmented top electrode 450 with segments having rectangular shape segments, disposed on a semiconductor laser. In the example shown, an individual longitudinal electrode segment comprises three lateral segments, a center (or central) segment 452, and two side segments 454 and 456. The lateral segments 452/454/456 may (or may not) be equally spaced and may (or may not) have substantially equal lengths ($L_t$) but different widths ($W_t$). For example, the width of the side lateral segments 454/456 may be larger than the width of the center segment 452 (although in other implementation different segments may have identical lengths and widths), and are equally spaced. In some cases, such as the example shown, $L_t$ can be smaller than $W_t$. In other examples, $L_t$ can be equal or larger than $W_t$.

In FIG. 4B, the lateral segments of an individual longitudinal segment of the top electrode 450, are positioned symmetrically in the lateral direction (e.g., along a direction parallel to the x-axis) with respect to a centerline 312 of the active waveguide 106 such that respective portions of the lateral segments on each side of the centerline are mirror images of each other with respect to the centerline 312.

In some cases, the width (W) of a segment can be between 0.1 and 1 microns, 1 and 10 microns, 10 and 100 microns, 100 and 1000 microns, or any range formed by any of these values or larger or smaller. In some cases the length (L) of an segment can be between 1 and 10 microns, 10 and 100 microns, 100 and 1000 microns, 1000 and 10000 microns, or any range formed by any of these values or larger or smaller. In some cases a spacing between the individual segments can be between 0.01 and 0.1 microns, 0.1 and 1 microns, 1 and 10 microns, 10 and 100 microns, 100 and 1000 microns, or any range formed by any of these values or larger or smaller.

FIG. 4C illustrates a top view of another example of longitudinally and laterally segmented top electrode including side lateral segments having protrusions, namely triangular lateral edges.

In the example shown, an individual longitudinal electrode segment comprises three lateral segments, a center segment 452, and two side segments 454 and 456. The lateral segments 452/454/456 may be equally spaced and may have identical lengths (L) but different widths (W). Other configurations and/or arrangement, however, are possible.

The discussion above may apply to the bottom electrode of a semiconductor laser in some implementations. For example, a shape, size, or other features of the bottom electrode may be similar to those of the top electrodes 310, 320, 450, or 460. In various implementations, the top and the bottom electrode of a semiconductor laser may be segmented electrodes.

In addition or alternative to segmenting the top or the bottom electrodes, in some implementations, the top layer 203 and/or the bottom layer 205 of the semiconductor laser 100 may be patterned to improve the electric isolation between individually controlled electrode segments (e.g., the longitudinal electrode segments). In some cases, by patterning the top layer 203 or the bottom layer 205 the current or current densities injected to a region of the gain layer 204a, below or above a longitudinal electrode segment, may become more independent from currents injected to the adjacent regions of the gain layer 204a located below adjacent longitudinal electrode segments. In some examples, the top layer 203 and/or the bottom layer 205 may be patterned by etching selected regions of top layer 203 (in a plane parallel to x-y plane) and/or the bottom layer 205 along a direction perpendicular to the top surface of the laser (parallel to y-axis). In some cases, the regions of the top layer 203 and/or the bottom layer 205 that are not covered by an electrode segment may be etched. In various implementations, the etch depth of the top layer 203 may extend to any vertical positon (parallel to y-axis) between the top surface of the top layer 203 and the middle layer 204 and/or the etch depth of the bottom layer 205 may extend to any vertical positon between the bottom surface of the bottom layer 203 and the middle layer 204. In some implementations, a patterned top layer 203 or a patterned bottom layer 205 may have a shape that is similar to the shape of segmented top electrodes 310, 320, 450, or 460.

In some examples, the longitudinal distribution of the injection current along the cavity of a semiconductor laser having non-segmented top and bottom electrode, and a patterned or segmented top layer 203 and/or bottom layer 205, may be tailored (e.g., to make it a more uniform distribution), by individually controlling the current and/or voltages applied on different longitudinal regions of a non-segmented electrode.

In some implementations, the isolation between current injected by the different electrode segments (e.g., longitudinal electrode segments) to the corresponding longitudinal regions of the gain layer may be improved by a current control layer positioned between the top electrode 110 or the bottom electrode 209, and the gain layer 204a.

In some cases, the current control layer can be a patterned high resistivity layer. In some cases, the patterned high resistivity layer may include high resistivity regions configured to reduce or block current flow through the regions of the top layer 203 or the bottom layer 205 that are not below an electrode segment (e.g., a longitudinal electrode segment). In some cases, the high resistivity regions of the current control layer may form a shape that is complementary with respect to the segmented electrodes described above (e.g., patterned electrodes 310, 320, 450 or 452).

In some cases, a current control layer can be a patterned low resistivity layer or a patterned high conductivity layer. A low resistivity layer may be a highly doped layer (e.g., a p++ layer) in contact with the top electrode 110. In some such cases, the patterned low resistivity layer may have a shape that is similar to the shape of the segmented top electrodes 310, 320, 450, or 460. Such patterned low resistivity layer may improve the level of individual or independent control over the injection currents generated along different longitudinal regions of the gain layer 204a.

In some cases, a shape and/or composition of a current control layer may be configured to support a current supply distribution above the gain layer 204a similar to the current supply distribution supported by the segmented electrodes 310, 320, 450, or 460, but using a single element electrode.

In some examples, a patterned high resistivity layer may comprise an ion implanted layer where the high resistivity regions are ion implanted. The implant ions may include H+, O+, or any other molecule that increases the resistivity of the semiconductor material upon implantation. Any of these implementations may be done easily in a single lithography step during the wafer fabrication process.

In some implementations, a semiconductor laser or optical amplifier having a segmented electrode (e.g., segmented top or bottom electrode) may be mounted on and connected to a submount (or carrier), for example, for interfacing with test instrumentation. In some cases, the submount may comprise electrically isolated conductive pads configured to be electrically connected to the longitudinal and/or lateral segments of the top and/or the bottom electrodes of the semiconductor laser. In some other cases, the electrically isolated conductive pads may be configured to be electrically connected to different regions of a non-segmented top electrode and/or a non-segmented bottom electrode of the semiconductor laser. The electrically isolated conductive pads may themselves provide the individual voltage and/or current control.

In some cases, the conductive pads of the submount may be composed of any metal or ceramic material including Cu, BeO, AlN, CuW, or any combination thereof. In some examples, the submount may comprise pre-deposited metal layers and/or solder for device attachment. The metal layers may include Ti, Pt, Pd, Au, AuSn, In, Ag, or any combination thereof.

Figure 5:
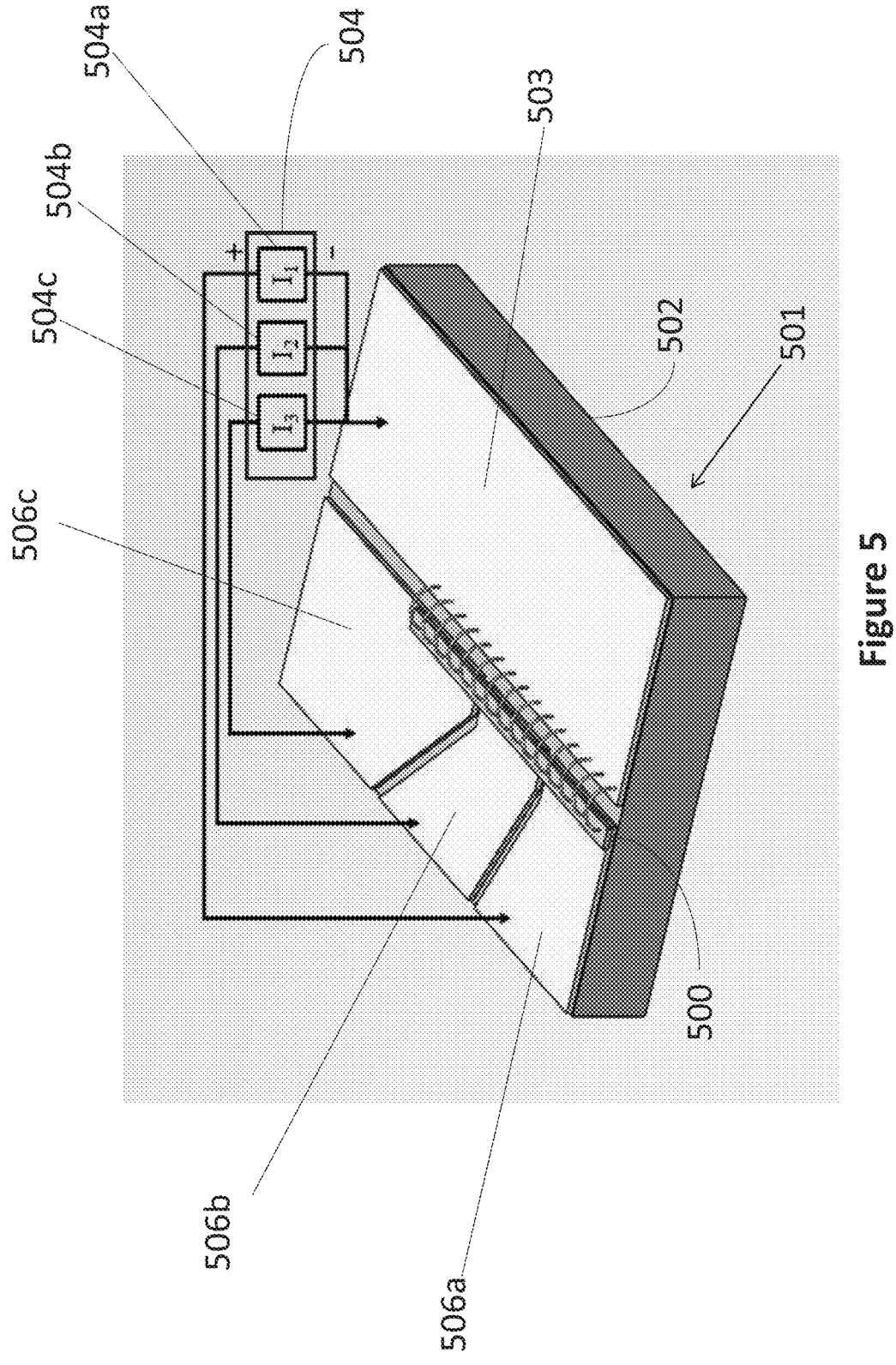
FIG. 5 illustrates a three-dimensional view of a semiconductor optical amplifier or a broad area semiconductor laser having a segmented top electrode mounted on a submount that supports controlling the current provided to individual segments or different groups of segments.

FIG. 5 illustrates a perspective view of a semiconductor laser or optical amplifier 500 (e.g., a broad area semiconductor laser) mounted on a submount 501 having four electrically conductive pads. In some cases, the semiconductor laser 500 may have a longitudinally segmented top electrode. The submount 501 comprises a substrate 502, a reference conductive pad 503, e.g., serving as the ground plane (or ground potential), and three conductive pads 506a/506b/506c for providing individually controlled currents and/or voltages. In some cases, the semiconductor laser or optical amplifier 500 may comprise a non-segmented bottom electrode connected to the reference conductive pad 503 via series of conductive lines (e.g., wire bonds). In the example shown the semiconductor laser or optical amplifier 500 is mounted upside down with the non-segmented bottom electrode facing up. In some cases, individual conductive pads 506a/506b/506c may be electrically connected to individual longitudinal segments of the top electrode of the semiconductor laser 500. In some other cases, individual conductive pad segments may be electrically connected to a group of longitudinal segments of the top electrode. In some cases, an electronic control system or control electronics 504 (e.g., a power supply or a current source) may control a voltage and/or a current provided to an individual conductive pad of the conductive pads 506a/506b/506c. For example, the electronic control system or control electronics 504 may control the voltage applied between the conductive pad 506a and the reference conductive pad 503 such that a current flowing through the pad (to the laser 500) stays close or equal to a set current for the conductive pad 506a. In the example shown, three channels 506a/506b/506c of the electronic control system or control electronics 504 provide voltage and/or current to three conductive pads 506a/506b/506c, respectively. In some cases, a user may select or adjust the set or target current $I_1$, $I_2$, and $I_3$ for the channels 506a/506b/506c respectively. In some other cases, a controller of the electronic control system 504 may select or adjust the set or target currents $I_1$, $I_2$, and $I_3$. For example, the controller may adjust the set or target currents $I_1$, $I_2$, and $I_3$ based at least in part on a measured parameter (e.g., output power) of the laser light output via, e.g., the front reflector of the broad area semiconductor laser 500.

As described above, in some cases, the longitudinal injection current distribution along a laser cavity may be tailored by controlling currents provided to different regions of the electrode (that are not electrically isolated). In some cases, the uniformity of the longitudinal injection current distribution along the laser cavity may be improved by connecting separate longitudinal regions of an electrode to separate current sources and independently controlling the currents provided to individual longitudinal regions of the electrode. For example, a first longitudinal region of the electrode may extend from a first end to a second end along the length of the electrode and a second region of the electrode (separate from the first region) may extend from a third end to a fourth end along the length of the electrode such that a longitudinal distance between the first end and the front reflector is smaller than a longitudinal distance between the third end and the front reflector. The first longitudinal region may, in some cases, be closer to the front reflector than the second longitudinal region and the second longitudinal region may be closer to the back reflector than the first longitudinal reflector. The first longitudinal region may be connected to a first current source (or a first channel of an electronic control system) having a first set or target current, and the second longitudinal region may be connected to a second current source (or a second channel of the electronic control system) having a second set or target current.

In some cases, the top electrode and the bottom electrodes of the semiconductor laser 500 can be non-segmented electrodes. In some such cases, the first conductive pad 506a may be electrically connected to a first longitudinal region of the electrode, the second conductive pad 506b may be electrically connected to a second longitudinal region of the electrode, and the third conductive pad 506c may be electrically connected to a third longitudinal region of the electrode. By adjusting the set or target currents of the current channels 506a/506b/506c that supply individually controlled currents to the conductive pads 506a/506b/506c, the current injected to the gain layer by different longitudinal regions of the electrode may be tailored, for example, such that the resulting longitudinal injection current distribution along the laser cavity becomes more uniform (e.g., compared to that of similar semiconductor laser driven by a non-segmented electrode connected to a single current source via a single conductive pad).

In some implementations, the longitudinal injection current distribution along the cavity of a semiconductor laser may be tailored using a non-segmented electrode that is connected to a single current source via multiple conductive lines (e.g., wire bonds). For example, different longitudinal regions of the electrode may be connected to the current source via different groups of conductive lines comprising different numbers of conductive lines. In some cases, a current provided to a longitudinal region of the electrode by a group of conductive lines may be dependent on, e.g., proportional to, the number of conductive lines in the group. For example, a number of wire bonds in a group of wire bonds connecting a first longitudinal region of the electrode to the current source may be smaller than that of a second longitudinal region of the electrode that is farther from the front reflector compared to the first longitudinal region (or vice versa). In some implementations, an electronic control system may provide individual currents to individual longitudinal regions of the electrode via different groups of conductive lines comprising a number of wires (e.g., wire bonds), so as to increase uniformity of a longitudinal distribution of injection current provided to the gain layer of a semiconductor laser or optical amplifier. At least two groups of conductive lines may comprise different number of conductive lines. In some examples, the number of conductive lines of a first group of conductive lines providing current to a first longitudinal region closer to a front reflector of the laser (or an output port of the amplifier) may be lager than that of a second group of conductive lines providing current to a second longitudinal region closer to a back reflector of the laser (or an input port of the amplifier). In some other examples, the number of conductive lines of the first group of conductive lines can may be smaller than that of a second group of conductive lines.

In any of the configurations described above, a patterned current control layer may improve the level of individual or independent control over the injection currents generated along different longitudinal regions of the gain layer and therefore the uniformity of the resulting longitudinal injection current profile.

In various implementations, the longitudinal injection current distribution along the cavity of a semiconductor laser may be tailored by segmenting a conductive layer of a conductive pad of the submount that provides current to the laser, and/or segmenting a conductive (or a low resistivity) layer in the top layer 203 and/or the bottom layer 205 of the semiconductor laser 100, and providing individually controlled currents and/or voltages to the corresponding individual segments.

In some implementations, the methods and configurations described above may be used to provide a tailored non-uniform longitudinal injection current distribution along the cavity of a semiconductor laser (or optical amplifier). In some examples, the voltage and/or currents provided to longitudinal regions of a non-segmented electrode or longitudinal electrode segments of a segmented electrode may be controlled and/or selected to increase the injection current in the gain layer at one or more longitudinal positions closer to the back reflector of the semiconductor laser (or the input port of the semiconductor optical amplifier). The methods, configurations, and implementations, however, should not be so limited. In some cases, for example, the voltage and/or currents provided to longitudinal regions of a non-segmented electrode or longitudinal electrode segments of a segmented electrode may be controlled and/or selected to increase the injection current in the gain layer at one or more longitudinal positions closer to the front reflector of the semiconductor laser (or the output port of the semiconductor optical amplifier). Still other methods, configurations and implementations are possible, for example, the electronic control system can be configured to provide other current distributions.

In various implementations, the electronic control system that controls currents and/or voltages provided to different longitudinal and/or lateral segments of a top or bottom electrode of a laser or an amplifier, may comprise a programmable or power/current/voltage supply. In some cases, the electronic control system may comprise a field programmable gate array. In some examples, the electronic control system may be integrated with the laser or amplifier. In some cases, the electronic control system may comprise a user interface or be in communication with a user interface that allows a user to adjust one or more parameter of the electronic control system (e.g., a set point, a threshold value, and the like). In some cases, the electronic control system may receive a signal (e.g., a feedback signal) from the laser, amplifier, or a device (e.g., a photodetector, or other optical measurement devices) and control a voltage and/or a current provided to an electrode segment (e.g., longitudinal or lateral segment), based at least in part on the signal. In some cases, the electronic control system may comprise a feedback loop configured to control a voltage and/or a current provided to electrode segments (e.g., longitudinal or lateral segments), based at least in part on a feedback signal to maintain a measured parameter (e.g., optical output power or intensity) of the laser or the amplifier within a preselected range (e.g., a range selected by a user via a user interface).

Although various implementations described above comprise rectangular optical waveguides (e.g., active waveguides having a constant or nearly constant lateral width along the length of the waveguide), in some designs the waveguide need not be rectangular and its width may vary. In some cases, the semiconductor laser (or optical amplifier) may comprise a flared active waveguide extended in the longitudinal direction (e.g. along z-axis) between the back reflector (or the input port) and the front reflector (or the output port). A flared active waveguide can have a lateral width along a lateral direction (e.g., along the x-direction) perpendicular to the longitudinal direction (e.g., z-direction), where the lateral width increases along the longitudinal direction (e.g., from the back reflector or input port to the front reflector output port or alternatively, most this distance).

In some implementations, the top or the bottom electrode of a flared semiconductor laser or optical amplifier (e.g., having a flared active waveguide), may comprise a segmented electrode having one or more features (e.g., size, shape, segment arrangement and the like) described above with respect to the segmented electrodes 310, 320, 450, and 460. Additionally, a longitudinal segment of the top or the bottom electrode of a flared semiconductor laser or optical amplifier may comprise lateral segments similar to those described above with respect to the longitudinal electrode segments 420, 430, and 440. In some examples, a longitudinally and laterally segmented top or bottom electrode of a flared semiconductor laser or optical amplifier may comprise one or more features described above with respect to electrodes 450, and 460.

Figures 6A, 6B:
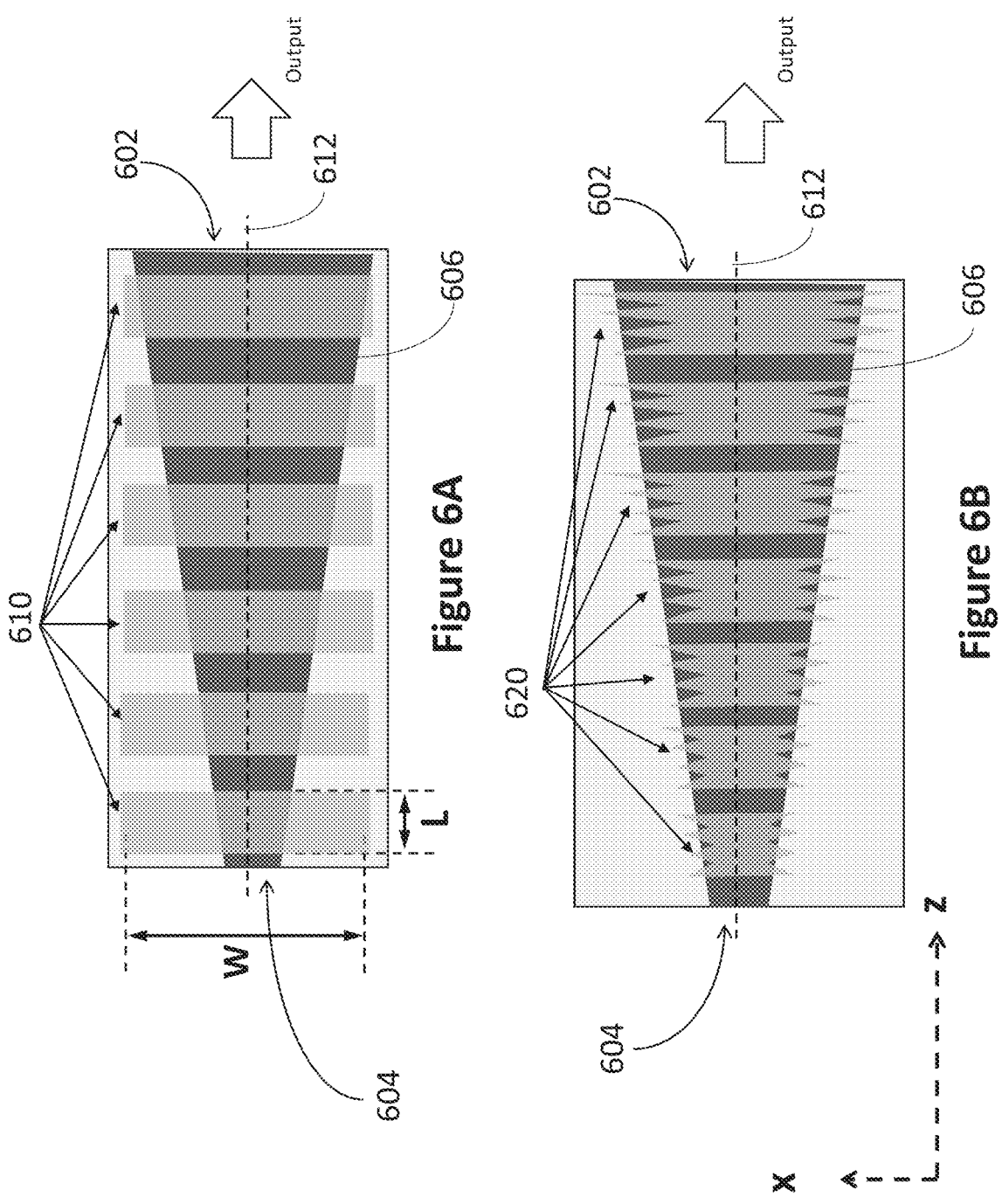
FIG. 6A illustrates a top view of an example of a longitudinally segmented top electrode disposed on a flared semiconductor laser or optical amplifier.
FIG. 6B illustrates a top view of an example of a longitudinally segmented top electrode having longitudinal segments with protrusions on the lateral edges, e.g., triangular shape lateral edges, disposed on a flared semiconductor laser or optical amplifier.

FIG. 6A illustrates a top view of an example of a longitudinally segmented (e.g., longitudinally segmented) top electrode 610 disposed on a semiconductor laser or optical amplifier having a flared active waveguide 606. The flared active waveguide 606 is extended in a longitudinal direction from an input port or back reflector 604 to an output port or front reflector 602. A width or an average width of flared active waveguide may increase from the input port or back reflector 604 to the output port or front reflector 602. In some examples, the segmented top electrode 610 may comprise equally spaced rectangular longitudinal electrode segments As illustrated, the electrode segments are arranged such that different segments are positioned at different longitudinal positions along the length of the waveguide, gain medium, and/or laser cavity (e.g., parallel to the z-axis). In the example shown, the length (L) of an individual segment is smaller than its width (W), different segments have identical lengths and widths, and are equally spaced. In some cases, the width (W) of a segment can be between 0.1 and 1 microns, 1 and 10 microns, 10 and 100 microns, 100 and 1000 microns, or any range formed by any of these values or larger or smaller. In some cases, the length (L) of a segment can be between 1 and 10 microns, 10 and 100 microns, 100 and 1000 microns, 1000 and 10000 microns, or any range formed by any of these values or larger or smaller. In some cases, a spacing between the individual segments can be between 0.01 and 0.1 microns, 0.1 and 1 microns, 1 and 10 microns, 10 and 100 microns, 100 and 1000 microns, or any range formed by any of these values or larger or smaller. In some cases, a width or an average width the longitudinal segments may vary along the longitudinal direction. For example, a longitudinal segment closer to the back reflector or input port 604 may have a width or an average width smaller than a second longitudinal segment closer to the front reflector or output port 602.

FIG. 6B illustrates a top view of another example of a longitudinally segmented top electrode 620 having equally spaced longitudinal electrode segments with protrusions at the edges, e.g., triangular-shaped lateral edges, disposed on a flared semiconductor laser or optical amplifier. An average lateral width (e.g., width along the x-axis) of the longitudinal electrode segments may vary in the longitudinal direction proportional to the lateral width of the corresponding flared active waveguide 606 in some implementations. In the example shown, the lateral width of the flared active waveguide 606 and the average lateral width of consecutive longitudinal segments increase from the back reflector or input port 604 to the front reflector or output port 602 although this is not required.

In the example shown, the lateral width of an individual longitudinal electrode segment increases and decreases multiple times with position along the length of the segment (e.g., parallel to z-axis) forming triangular lateral edges. In some cases, the width (e.g., parallel to x-axis) of an individual longitudinal electrode segment may increase and decrease multiple times with position along the length such that at least one lateral edge of the segment has protrusions, e.g., is triangular shaped. In some examples, one lateral edge of a segment may have a protrusion, e.g., triangular shape, and the other lateral edge may be straight (e.g., parallel to the active waveguide or z-axis).

In various implementations, a triangular shaped lateral edge of a longitudinal electrode segment may comprise equilateral or right triangles or equilateral triangles. Other uniform or non-uniform shapes are possible. In some cases, a lateral edge of a longitudinal electrode segment may comprise 1, 2, 3, 4, 5, or 10 triangles or lateral protrusions having other shapes.

In some cases, the width of an individual longitudinal electrode segment may increase and decrease multiple times with position along the length such that at least one lateral edge of the segment comprises a nonlinear shape (e.g., a sinusoidal shape, a parabolic shape and the like).

In some cases, a lateral edge of an individual longitudinal electrode segment having a width that increases and decreases multiple times along the longitudinal direction, may provide an injection current distribution to the gain layer having an average width equal to the average width of the flared active waveguide 606.

The individual longitudinal segments of the longitudinally segmented electrode 610 and 620 extend symmetrically in the lateral direction (e.g., along x-axis) with respect to a centerline 612 of the active waveguide 606 such that respective portions of the segment on each side of the centerline are mirror images of each other with respect to the centerline 612. In some cases, an individual longitudinal electrode segment may not be symmetric and/or may be positioned asymmetrically with respect to the centerline 612 of the flared active waveguide 606.

FIG. 7A illustrates a top view of an example of longitudinally and laterally segmented top electrode 710 with segments having rectangular shape segments, disposed on a flared semiconductor laser or optical amplifier 606. In the example shown, an individual longitudinal electrode segment comprises three lateral segments, a central segment 752, and two side segments 754 and 756. The lateral segments 752/754/756 may (or may not) be equally spaced and may (or may not) have substantially equal lengths ($L_t$) but different widths ($W_t$). For example, the width of the side lateral segments 754/756 may be different from the width of the central segment 752. In the example shown, the width of the side lateral segments 754/756 and/or the central segment 752 of the subsequent longitudinal segments may decrease and increase respectively, from the back reflector (or input port) 604 to the front reflector (or output port) 602 or a portion thereof such as most of this distance. In some examples, the width of the central segment 752 of the subsequent longitudinal segments may increase proportional to the lateral with of the flared active waveguide 606. Advantageously, tailoring the width of the side lateral segments 754/756 and/or the central segment 752 of the longitudinal segments of the electrode 710 according to the lateral width of the flared active waveguide 606 may facilitate controlling the lateral profile of the optical mode propagating along the flared waveguide 606. In some cases, such as the example shown, $L_t$ can be smaller than $W_t$. In other examples, $L_t$ can be equal or larger than $W_t$.

In FIG. 7A, the lateral segments of an individual longitudinal segment of the top electrode 750, are positioned symmetrically in the lateral direction (e.g., along a direction parallel to the x-axis) with respect to a centerline 712 of the active waveguide 606 such that respective portions of the lateral segments on each side of the centerline are mirror images of each other with respect to the centerline 712.

In some cases, the width ($W_t$) of a segment can be between 0.1 and 1 microns, 1 and 10 microns, 10 and 100 microns, 100 and 1000 microns, or any range formed by any of these values or larger or smaller. In some cases, the length (L) of an segment can be between 1 and 10 microns, 10 and 100 microns, 100 and 1000 microns, 1000 and 10000 microns, or any range formed by any of these values or larger or smaller. In some cases a spacing between the individual segments can be between 0.01 and 0.1 microns, 0.1 and 1 microns, 1 and 10 microns, 10 and 100 microns, 100 and 1000 microns, or any range formed by any of these values or larger or smaller.

FIG. 7B illustrates a top view of another example of longitudinally and laterally segmented top electrode including side lateral segments having protrusions, e.g., triangular lateral edges, disposed on the flared waveguide 606 of a flared semiconductor laser or optical amplifier. In this example, the average width of the side lateral segments and the central segment of the subsequent longitudinal segments may both increase from the back reflector (or input port) 604 to the front reflector (or output port) 602. In some examples, the width or the average width of one or both the central segment and the lateral segments of the subsequent longitudinal segments may increase proportional to the lateral width of the flared active waveguide 606. Advantageously, the protrusion, e.g., triangular lateral edges, of the side lateral segments and their tailored average width (e.g., based on the width of the active waveguide 606) may facilitate controlling the lateral profile of the optical mode propagating along the flared waveguide 606.

The discussion above may apply to the bottom electrode of a semiconductor laser or optical amplifier in some implementations. For example, a shape, size, or other features of the bottom electrode may be similar to those of the top electrodes 610, 620, 710, or 720. In various implementations, the top and the bottom electrode of a semiconductor laser may be segmented electrodes.

In various implementations, the longitudinally segmented top and/or bottom electrode designs described above may be used for providing a tailored, for example, a uniform or near uniform injection current distribution along length of the active waveguide of a semiconductor laser or optical amplifier. In some examples, the number of longitudinal segments, the geometrical characteristics of a longitudinal segments, a number and geometrical characteristics of lateral segments of a longitudinal segment, and the position of a longitudinal segment with respect to the front reflector or output port, or with respect to the back reflector or input port, or any combination of these, may be determined based on the characteristics of the semiconductor laser or optical amplifier.

In various implementations, a master oscillator power amplifier (MOPA) device may comprise a semiconductor laser and a semiconductor amplifier where at least one of them comprise a segmented (e.g., longitudinally segmented) top and/or bottom electrode. In some examples, one or both master oscillator (laser) and power amplifier (optical amplifier), may comprise a flared active waveguide. As described above, when the active waveguide is flared and one of the top or bottom electrode is flared, the widths or average widths of the corresponding longitudinal segments may be tailored according to the shape of the flared active waveguide.

Figure 8:
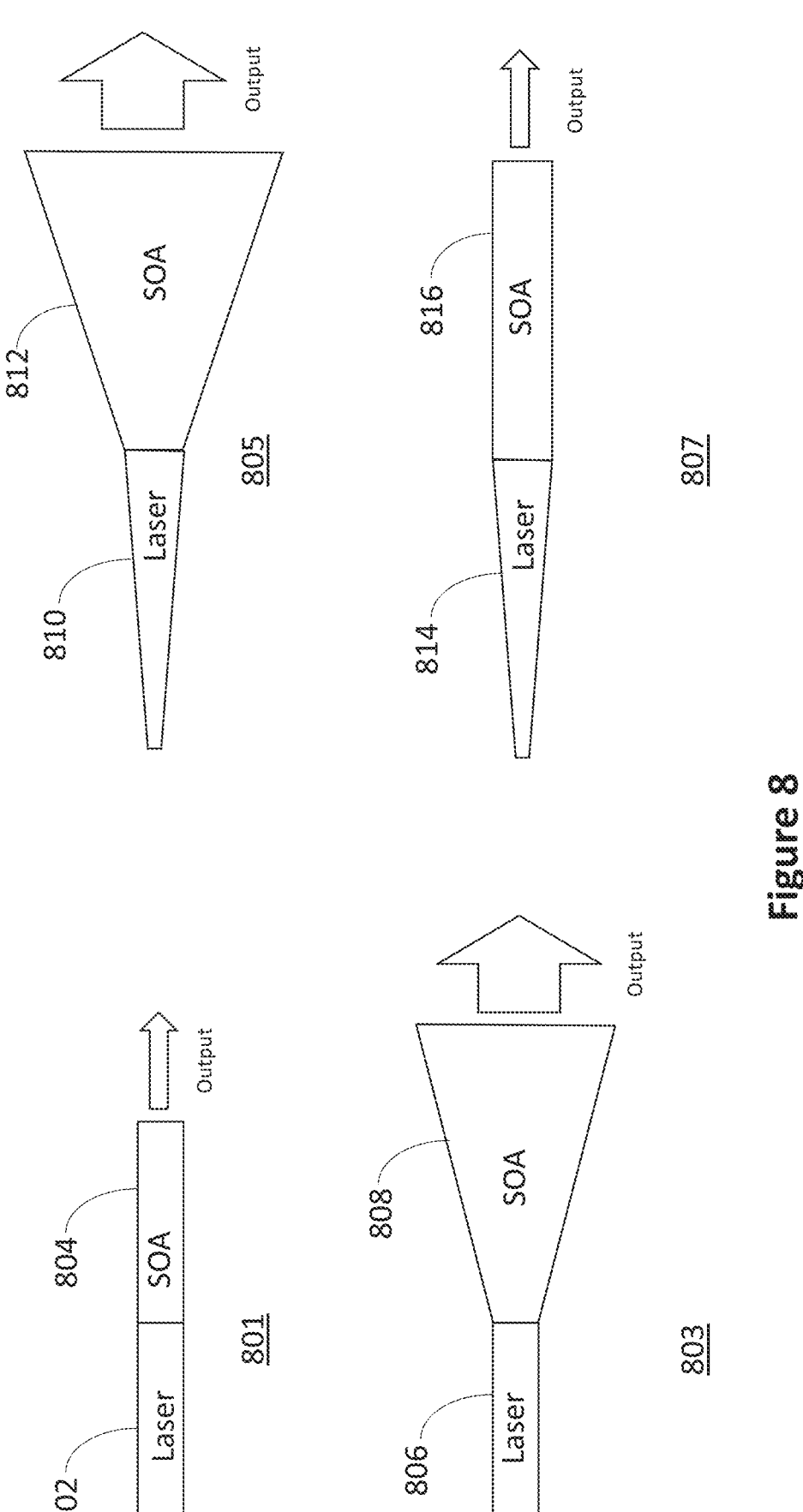
FIG. 8 illustrates top view diagrams of four MOPA devices having different combinations of flared and rectangular laser and amplifier sections.

FIG. 8 illustrates top view diagrams of four different MOPA devices. The MOPA 801 comprises a semiconductor laser 802 and a semiconductor optical amplifier (SOA) 804 comprising rectangular shape active waveguides. In some cases, one or both the laser 802 and the SOA 804 may comprise longitudinally segmented electrodes similar to the electrodes 310, 320 (in FIGS. 3B-3C) or longitudinally and laterally segmented electrodes similar to the electrodes 450, or 460 (in FIGS. 4B-4C).

The MOPA 803 comprises a semiconductor laser 806 comprising a rectangular active waveguide and a semiconductor optical amplifier (SOA) 808 comprising a flared active waveguide. In some implementations, the laser 806 and the SOA 808 may comprise the same gain material. In some cases, one or both the laser 806 and the SOA 808 may comprise longitudinally segmented electrodes. The laser 806 may comprise longitudinally segmented electrodes similar to the electrodes 310, 320 (in FIGS. 3B-3C), or longitudinally and laterally segmented electrodes similar to the electrodes 450, or 460 (in FIGS. 4B-4C). The SOA 808 may comprise longitudinally segmented electrodes similar to the electrodes 610, 620 (in FIGS. 6A-6B) or longitudinally and laterally segmented electrodes similar to the electrodes 710, or 720 (in FIG. 7A-7B).

The MOPA 805 comprises a semiconductor laser 810 and a semiconductor optical amplifier (SOA) 812 comprising flared active waveguides. In some implementations, the laser 810 and the SOA 812 may comprise the same gain material. In some cases, one or both the laser 810 and the SOA 812 may comprise longitudinally segmented electrodes similar to the electrodes 610, 620 (in FIGS. 6A-6B) or longitudinally and laterally segmented electrodes similar to the electrodes 710, or 720 (in FIG. 7A-7B).

The MOPA 807 comprises a semiconductor laser 814 comprising a flared active waveguide and a semiconductor optical amplifier (SOA) 816 comprising a rectangular active waveguide. In some implementations, the laser 814 and the SOA 816 may comprise the same gain material. In some cases, one or both the laser 814 and the SOA 816 may comprise longitudinally segmented electrodes. The laser 814 may comprise longitudinally segmented electrodes similar to the electrodes 610, 620 (in FIGS. 6A-6B) or longitudinally and laterally segmented electrodes similar to the electrodes 710, or 720 (in FIG. 7A-7B). The SOA 808 may comprise longitudinally segmented electrodes similar to the electrodes 310, 320 (in FIGS. 3B-3C), or longitudinally and laterally segmented electrodes similar to the electrodes 450, or 460 (in FIGS. 4B-4C).

In various implementations, one or more electronic systems may provide currents and/or voltages to the longitudinally segmented electrodes of the laser 802/806/810/814 and/or the SOA 804/808/812/816. The one or more electronic systems may include, single channel or multichannel voltage or current sources. In some cases, the one or more electronic systems may a comprise at least one non-transitional memory storing machine-executable instructions and at least one processor configured to execute the machine-executable instructions to control currents and/or voltages provided to the longitudinal electrode segments of the laser and/or SOA.

EXAMPLE EMBODIMENTS

Example embodiments described herein have several features, no single one of which is indispensable or solely responsible for their desirable attributes. A variety of example systems and methods are provided below.

Group 1

Example 1. A semiconductor laser system comprising:

a semiconductor laser comprising:

a front optical reflector, a back optical reflector, said front and back optical reflectors disposed with respect to each other to form a laser cavity therebetween, an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;

an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction; and an electronic control system configured to provide individually controlled currents and/or voltages to individual longitudinal segments so as to increase uniformity of a longitudinal distribution of injection current provided to the gain layer.

Example 2. The semiconductor laser system of Example 1, wherein the semiconductor laser is a broad area laser.

Example 3. The semiconductor laser system of Example 1, wherein the semiconductor laser is a Fabry-Perot laser.

Example 4. The semiconductor laser system of any of the Examples above, wherein the reflectivity of the front reflector is smaller than the reflectivity of the back reflector.

Example 5. The semiconductor laser system of any of the Examples above, wherein the electronic control system is configured to provide individually controlled currents and/or voltages to individual longitudinal segments to make the longitudinal distribution of injection current provided to the gain layer more uniform than a longitudinal injection current distribution generated by a non-segmented electrode.

Example 6. The semiconductor laser system of any of the Examples above, wherein the active waveguide comprises a III-V compound semiconductor.

Example 7. The semiconductor laser system of any of the Examples above, wherein the lengths of the longitudinal segments are equal to each other.

Example 8. The semiconductor laser system of any of the Examples above, wherein the widths of the longitudinal segments are equal to each other.

Example 9. The semiconductor laser of any of Examples above, wherein said separate longitudinal segments are equally spaced in the longitudinal direction.

Example 10. The semiconductor laser system of any of Examples above, wherein the lengths of at least two longitudinal sections are not equal.

Example 11. The semiconductor laser system of any of Examples above, wherein the widths of at least two longitudinal sections are not equal.

Example 12. The semiconductor laser system of any of Examples 1-8 and 10-11, wherein a spacing between at least two consecutive longitudinal segments is smaller than the lengths of the at least two longitudinal segments.

Example 13 The semiconductor laser system of any of Examples above, wherein an individual longitudinal segment is extended symmetrically in the lateral direction with respect to a centerline of the active waveguide.

Example 14. The semiconductor laser system of any of Examples above, wherein an individual longitudinal segment comprises a rectangular shape.

Example 15. The semiconductor laser system of any of Examples above, wherein the width of an individual longitudinal segment increases and decreases multiple times with position along the length of the longitudinal segment.

Example 16. The semiconductor laser system of Example 15, wherein the width of the individual longitudinal segment increases and decreases linearly.

Example 17. The semiconductor laser system of Example 15, wherein the width of the individual longitudinal segment increases and decreases nonlinearly.

Example 18. The semiconductor laser system of any of Examples above, wherein a lateral edge of an individual longitudinal segment comprises a shape so as to provide an injection current distribution to the gain layer having an average width equal to the average width of the individual segment.

Example 19. The semiconductor laser system of any of Examples above, wherein an individual longitudinal segment comprises two or more lateral segments.

Example 20. The semiconductor laser system of Example 19, wherein an individual lateral segment has a length in the longitudinal direction, wherein the lengths of individual lateral segments are equal.

Example 21. The semiconductor laser system of Example 19 or 20, wherein the lateral segments extend symmetrically in the lateral direction with respect to a centerline of the active waveguide.

Example 22. The semiconductor laser system of any of Examples 19-21, wherein a lateral segment comprises a rectangular shape.

Example 23. The semiconductor laser system of any of Examples above, wherein the electrode comprises a top electrode.

Example 24. The semiconductor laser system of any of Examples above, wherein the electrode comprises a bottom electrode.

Example 25. The semiconductor laser system of any of Examples above, wherein the electronic control system is configured to provide individually controlled currents and/or voltages to the individual longitudinal segments to increase a slope efficiency of the semiconductor laser.

Example 26. The semiconductor laser system of any of Examples above, further comprising a photodetector configured to receive at least a portion of laser light generated by the semiconductor laser system and generate a signal indicative of an optical power of the laser light.

Example 27. The semiconductor laser system Example 26, wherein the photodetector receives the at least a portion of the laser light via the front reflector.

Example 28. The semiconductor laser of any of Examples 26 and 27, wherein the electronic control system is configured to provide individually controlled currents and/or voltages to the individual longitudinal segments based at least in part on the signal received from the photodetector.

Example 29. The semiconductor laser system of Example 26, wherein the electronic control system is configured to provide a first longitudinal injection current profile below and close to a lasing threshold and dynamically adjust the individually controlled currents and/or voltages to provide a second longitudinal injection current profile above the lasing threshold.

Example 30. The semiconductor laser system of Example 29, wherein the transition from the first to the second longitudinal injection current profile comprises a gradual transition.

Example 31. The semiconductor laser system of Example 29, wherein the transition from the first to the second longitudinal injection current profile comprises a stepwise transition.

Example 32. The semiconductor laser of any of Examples above, wherein the electronic control system is configured to provide individually controlled currents and/or voltages to the individual longitudinal segments to increase the optical power of laser light.

Example 33. The semiconductor laser system of any of Examples above, wherein the active waveguide is flared.

Example 34. The semiconductor laser system of Example 33, wherein an average width of a first longitudinal segment closer to the back reflector is smaller than an average width of a second longitudinal segment closer to the front reflector.

Example 35. The semiconductor laser system of any of Examples 33 and 34, wherein an average width of central lateral segments of the longitudinal segments increases at least along a portion of the waveguide length in the longitudinal direction.

Example 36. The semiconductor laser system of any of Examples above, further comprising a semiconductor optical amplifier configured to receive light output from the front optical reflector via an input port to be guided therein, amplify at least a portion of the input light that is guided in the optical amplifier system, and output at least a portion of the amplified portion of the input light via an output port, wherein the optical amplifier comprises:

a second active waveguide extending in the longitudinal direction between the input port and the output port, wherein the second active waveguide comprises a second gain layer configured to provide optical gain to the light guided in the second active waveguide.

Example 37. The semiconductor system of Example 36, wherein the semiconductor optical amplifier further comprises a second electrode disposed with respect to the second active waveguide, said second electrode comprising a second plurality of separate electrically isolated longitudinal segments arranged in the longitudinal direction, wherein the electronic control system configured to provide second individually controlled currents and/or voltages to individual second longitudinal segments.

Example 38. The semiconductor system of Example 36, wherein the semiconductor optical amplifier further comprises a non-segmented electrode disposed with respect to the second active waveguide.

Example 39. The semiconductor system of Example 37 and 38, wherein the second active waveguide has a second waveguide width along a lateral direction perpendicular to the longitudinal direction, and wherein the second waveguide width increases at least along a portion of the waveguide length in the longitudinal direction.

Example 40. The semiconductor system of any of Example 37 and 38, wherein the second active waveguide has a second waveguide width along a lateral direction perpendicular to the longitudinal direction, and wherein an average value of the second waveguide is does not change along of the waveguide length in the longitudinal direction.

Example 41. A semiconductor laser system comprising:
a semiconductor laser comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction; and
an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction, and wherein the width of an individual longitudinal segment does not increase and decrease multiple times along the longitudinal direction.

Example 42. The semiconductor laser system of Example 41 wherein the waveguide width increases at least along a portion of the waveguide length in the longitudinal direction.

Example 43. The semiconductor laser system of Example 42, wherein the width of an individual longitudinal segment increases along the longitudinal direction.

Example 44. The semiconductor laser system of Example 41, wherein an average value of the waveguide width is constant along the waveguide length in the longitudinal direction.

Example 45. The semiconductor laser system of Example 41, 42 or 44, wherein the width of an individual longitudinal segment is constant along the longitudinal direction.

Example 46. The semiconductor laser system of any of Examples 41-45, further comprising an electronic control system configured to provide individually controlled currents and/or voltages to individual longitudinal segments.

Example 47. The semiconductor laser system of any of the Examples 41-46, wherein the individual longitudinal segment does not include a protrusion.

Example 48. The semiconductor laser system of any of the Examples 41-47, wherein the width of an individual longitudinal segment does not increase and decrease in width.

Example 49 The semiconductor laser system of any of Examples 41-48, wherein the width of an individual longitudinal segment does not decrease along the longitudinal direction.

Example 50. A semiconductor laser system comprising:
a semiconductor laser chip comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide;
a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the front reflector compared to the third end; and
an electronic control system configured to at least provide a first current to the first conductive pad and a second current to the second conductive pad so as to increase uniformity of a longitudinal distribution of injection current provided to the gain layer.

Example 51. The semiconductor laser system of Example 50 above, wherein the electrode comprises a top electrode.

Example 52. The semiconductor laser system of Example 51, wherein top electrode is segmented.

Example 53. The semiconductor laser system of Example 51, wherein top electrode is not segmented.

Example 54. The semiconductor laser system of Example 50, wherein the electrode comprises a bottom electrode.

Example 55. The semiconductor laser system of Example 54, wherein the bottom electrode is segmented.

Example 56. The semiconductor laser system of Example 54, wherein the bottom electrode is not segmented.

Example 57. A semiconductor laser system comprising:

a semiconductor laser comprising:

a front optical reflector, a back optical reflector, said front and back optical reflectors disposed with respect to each other to form a laser cavity therebetween, an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;

an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction; and an electronic control system configured to provide individually controlled currents and/or voltages to individual longitudinal segments.

Example 58. The semiconductor laser of Example 57, wherein the electrode comprises a top electrode.

Example 59. The semiconductor laser of Example 57, wherein the electrode comprises a bottom electrode.

Example 60. The semiconductor laser of any of Examples 57-59, wherein the electronic control system is configured to provide individually controlled currents and/or voltages to the individual longitudinal segments to increase an optical power of laser light output.

Example 61. The semiconductor laser system of any of Examples 57-59, wherein the electronic control system is configured to provide individually controlled currents and/or voltages to the individual longitudinal segments to increase a slope efficiency of the semiconductor laser.

Example 62. The semiconductor laser system of any of Examples 57-61, further comprising a photodetector configured to receive at least a portion of laser light generated by the semiconductor laser system and generate a signal indicative of an optical power of the laser light.

Example 63. The semiconductor laser system Example 62, wherein the photodetector receives the at least a portion of the laser light via the front reflector.

Example 64. The semiconductor laser of any of Examples 62 and 63, wherein the electronic control system is configured to provide individually controlled currents and/or voltages to the individual longitudinal segments based at least in part on the signal received from the photodetector.

Example 65. The semiconductor laser of any of Examples 57-65, wherein the electronic control system is configured to provide individually controlled currents and/or voltages to individual longitudinal segments so as to tailor a longitudinal distribution of injection current provided to the gain layer.

Example 66. A semiconductor laser system comprising:

a semiconductor laser chip comprising:

a front optical reflector, a back optical reflector, said front and back optical reflectors disposed with respect to each other to form a laser cavity therebetween, an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;

an electrode disposed with respect to the active waveguide;

a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the front reflector compared to the third end; and an electronic control system configured to at least provide a first current to the first conductive pad and a second current to the second conductive pad.

Example 67. The semiconductor laser system of Example 66 above, wherein the electrode comprises a top electrode.

Example 68. The semiconductor laser system of Example 67, wherein top electrode is segmented.

Example 69. The semiconductor laser system of Example 67, wherein top electrode is not segmented.

Example 70. The semiconductor laser system of Example 66, wherein the electrode comprises a bottom electrode.

Example 71. The semiconductor laser system of Example 70, wherein the bottom electrode is segmented.

Example 72. The semiconductor laser system of Example 70, wherein the bottom electrode is not segmented.

Example 73. The semiconductor laser system of any of Examples 66-72, wherein the electronic control system is configured to at least provide a first current to the first conductive pad and a second current to the second conductive pad so as to tailor a longitudinal distribution of injection current provided to the gain layer.

Example 74. The semiconductor laser system of any of Examples 1-14, 19-40 and 57-65, wherein the width of an individual longitudinal segment does not increase and decrease multiple times along the longitudinal direction.

Example 75. The semiconductor laser system of any of the Examples 1-14 19-40, 57-65, and 74, wherein the individual longitudinal segment does not include a protrusion.

Example 76. The semiconductor laser system of any of the Examples 1-14 19-40, 57-65, and 74-75, wherein the width of an individual longitudinal segment does not increase and decrease in width.

Example 77. The semiconductor laser system of any of Examples 1-14 19-40, 57-65, and 74-76, wherein the width of an individual longitudinal segment does not decrease along the longitudinal direction.

Example 78. The semiconductor laser system of any of Examples 1-32 36-40, 57-65, and 74-77, wherein the active waveguide is not flared.

Group 2

Example 1. A semiconductor laser system comprising:

a semiconductor laser comprising:

a front optical reflector, a back optical reflector, said front and back optical reflectors disposed with respect to each other to form a laser cavity therebetween, an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;

an electrode disposed with respect to the active waveguide, said electrode comprising a plurality of separate electrically isolated longitudinal segments arranged in the longitudinal direction, wherein an individual longitudinal segment has a length along the longitudinal direction and a width along a lateral direction perpendicular to the longitudinal direction, wherein the active waveguide is not flared.

Example 2. The semiconductor laser system of Example 1, wherein the semiconductor laser is a broad area laser.

Example 3. The semiconductor laser system of Example 1, wherein the semiconductor laser is a Fabry-Perot laser.

Example 4. The semiconductor laser system of any of the Examples above, wherein the reflectivity of the front reflector is smaller than the reflectivity of the back reflector.

Example 5. The semiconductor laser system of any of the Examples above, further comprising an electronic control system configured to provide individually controlled currents and/or voltages to individual longitudinal segments to make the longitudinal distribution of injection current provided to the gain layer more uniform than a longitudinal injection current distribution generated by a non-segmented electrode.

Example 6. The semiconductor laser system of any of the Examples above, wherein the active waveguide comprises a III-V compound semiconductor.

Example 7. The semiconductor laser system of any of the Examples above, wherein the lengths of the longitudinal segments are equal to each other.

Example 8. The semiconductor laser system of any of the Examples above, wherein the widths of the longitudinal segments are equal to each other.

Example 9. The semiconductor laser of any of Examples above, wherein said separate longitudinal segments are equally spaced in the longitudinal direction.

Example 10. The semiconductor laser system of any of Examples above, wherein the lengths of at least two longitudinal sections are not equal.

Example 11. The semiconductor laser system of any of Examples above, wherein the widths of at least two longitudinal sections are not equal.

Example 12. The semiconductor laser system of any of Examples 1-8 and 10-11, wherein a spacing between at least two consecutive longitudinal segments is smaller than the lengths of the at least two longitudinal segments.

Example 13. The semiconductor laser system of any of Examples above, wherein an individual longitudinal segment is extended symmetrically in the lateral direction with respect to a centerline of the active waveguide.

Example 14. The semiconductor laser system of any of Examples above, wherein an individual longitudinal segment comprises a rectangular shape.

Example 15. The semiconductor laser system of any of Examples above, wherein the width of an individual longitudinal segment increases and decreases multiple times with position along the length of the longitudinal segment.

Example 16. The semiconductor laser system of Example 15, wherein the width of the individual longitudinal segment increases and decreases linearly.

Example 17. The semiconductor laser system of Example 15, wherein the width of the individual longitudinal segment increases and decreases nonlinearly.

Example 18. The semiconductor laser system of any of Examples above, wherein a lateral edge of an individual longitudinal segment comprises a shape so as to provide an injection current distribution to the gain layer having an average width equal to the average width of the individual segment.

Example 19. The semiconductor laser system of any of Examples above, wherein an individual longitudinal segment comprises two or more lateral segments.

Example 20. The semiconductor laser system of Example 19, wherein an individual lateral segment has a length in the longitudinal direction, wherein the lengths of individual lateral segments are equal.

Example 21. The semiconductor laser system of Example 19 or 20, wherein the lateral segments extend symmetrically in the lateral direction with respect to a centerline of the active waveguide.

Example 22. The semiconductor laser system of any of Examples 19-21, wherein a lateral segment comprises a rectangular shape.

Example 23. The semiconductor laser system of any of Examples above, wherein the electrode comprises a top electrode.

Example 24. The semiconductor laser system of any of Examples above, wherein the electrode comprises a bottom electrode.

Example 25. The semiconductor laser system of any of Examples 1-14, and 19-24, wherein the width of an individual longitudinal segment does not increase and decrease multiple times along the longitudinal direction.

Example 26. The semiconductor laser system of any of the Examples 1-14 and 19-25 wherein the individual longitudinal segment does not include a protrusion.

Example 27. The semiconductor laser system of any of the Examples 1-14 and 19-26 wherein the width of an individual longitudinal segment does not increase and decrease in width.

Example 28. The semiconductor laser system of any of Examples 1-14 and 19-27 wherein the width of an individual longitudinal segment does not decrease along the longitudinal direction.

Example 29. The semiconductor laser system of any of Examples 1-4 and 6-28 above, further comprising an electronic control system configured to provide individually controlled currents and/or voltages to individual longitudinal segments Example 30. The semiconductor laser of Example 29, wherein the electronic control system is configured to provide individually controlled currents and/or voltages to the individual longitudinal segments to increase an optical power of laser light.

Example 31. The semiconductor laser system of any of Examples 29-30, wherein the electronic control system is configured to provide individually controlled currents and/or voltages to the individual longitudinal segments to increase a slope efficiency of the semiconductor laser.

Example 32. The semiconductor laser system of any of Examples 29-31, further comprising a photodetector configured to receive at least a portion of laser light generated by the semiconductor laser system and generate a signal indicative of an optical power of the laser light.

Example 33. The semiconductor laser system Example 32, wherein the photodetector receives the at least a portion of the laser light via the front reflector.

Example 34. The semiconductor laser of any of Examples 32 and 33, wherein the electronic control system is configured to provide individually controlled currents and/or voltages to the individual longitudinal segments based at least in part on the signal received from the photodetector.

Example 35. The semiconductor laser of any of Examples 29-34, wherein the electronic control system configured to provide individually controlled currents and/or voltages to individual longitudinal segments so as to tailor a longitudinal distribution of injection current provided to the gain layer.

Example 36. The semiconductor laser system of any of Examples 29-35, wherein the electronic control system configured to provide individually controlled currents and/or voltages to individual longitudinal segments so as to increase uniformity of a longitudinal distribution of injection current provided to the gain layer Group 3

Example 1. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide said electrode comprise a plurality of separate electrically isolated longitudinal segments arranged in the longitudinal direction, wherein an individual longitudinal segment has a length along the longitudinal direction and an electrode width along the lateral direction; and an electronic control system configured to provide individually controlled currents and/or voltages to individual longitudinal segments so as to increase uniformity of a longitudinal distribution of injection current provided to the gain layer.

Example 2. The optical amplifier system of Example 1, wherein the electronic control system is configured to provide individually controlled currents and/or voltages to individual longitudinal segments to make the longitudinal distribution of injection current provided to the gain layer more uniform than a longitudinal injection current distribution generated by a non-segmented electrode.

Example 3. The optical amplifier system of any of the Examples above, wherein the active waveguide comprises a III-V compound semiconductor.

Example 4. The optical amplifier system of any of the Examples above, wherein the lengths of the longitudinal segments are equal to each other.

Example 5. The optical amplifier system of any of the Examples above, wherein the widths of the longitudinal segments are equal to each other.

Example 6. The optical amplifier system of any of Examples above, wherein said separate longitudinal segments are equally spaced in the longitudinal direction.

Example 7. The optical amplifier system of any of Examples above, wherein the lengths of at least two longitudinal sections are not equal.

Example 8. The optical amplifier system of Example 1, wherein the widths of at least two longitudinal sections are not equal.

Example 9. The optical amplifier system of any of Examples 1-5 and 7-8, wherein a spacing between at least two consecutive longitudinal segments is smaller than the lengths of the at least two longitudinal segments.

Example 10. The optical amplifier system of any of Examples above, wherein an individual longitudinal segment is extended symmetrically in the lateral direction with respect to a centerline of the active waveguide.

Example 11. The optical amplifier system of any of Examples above, wherein an individual longitudinal segment comprises a rectangular shape.

Example 12. The optical amplifier system of any of Examples above, wherein the width of an individual longitudinal segment increases and decreases multiple times with position along the length of the longitudinal segment.

Example 13. The optical amplifier system of Example 12, wherein the width of the individual longitudinal segment increases and decreases linearly.

Example 14. The optical amplifier system of Example 12, wherein the width of the individual longitudinal segment increases and decreases nonlinearly.

Example 15. The optical amplifier system of any of Examples above, wherein a lateral edge of an individual longitudinal segment comprises a shape so as to provide an injection current distribution to the gain layer having an average width equal to the average width of the individual segment.

Example 16. The optical amplifier system of any of Examples above, wherein an individual longitudinal segment comprises two or more lateral segments.

Example 17. The optical amplifier system of Example 16, wherein an individual lateral segment has a length in the longitudinal direction, wherein the lengths of individual lateral segments are equal.

Example 18. The optical amplifier system of Example 16, wherein the lateral segments extend symmetrically in the lateral direction with respect to a centerline of the active waveguide.

Example 19. The optical amplifier system of any of Examples 16-18, wherein a lateral segment comprises a rectangular shape.

Example 20. The optical amplifier system of any of Examples above, wherein the electrode comprises a top electrode.

Example 21. The optical amplifier system of any of Examples above, wherein the electrode comprises a bottom electrode.

Example 22. The optical amplifier system of any of Examples above, wherein the electronic control system is configured to provide individually controlled currents and/or voltages to the individual longitudinal segments to increase an efficiency of the optical amplifier system.

Example 23. The optical amplifier system of any of Examples above, further comprising a photodetector configured to receive at least a portion of the amplified portion of the input light and generate a signal indicative of an optical power of the amplified portion of the input light.

Example 24. The optical amplifier system of Example 23, wherein the photodetector receives the at least a portion of the amplified portion of the input light from the output port.

Example 25. The optical amplifier system of any of Examples 23 and 24, wherein the electronic control system is configured to provide individually controlled currents and/or voltages to the individual longitudinal segments based at least in part on the signal received from the photodetector.

Example 26. The optical amplifier system of any of Examples above, wherein the electronic control system is configured to provide individually controlled currents and/or voltages to the individual longitudinal segments to increase an optical power of the amplified portion of the input light.

Example 27. The optical amplifier system of any of Examples above, wherein the active waveguide is flared.

Example 28. The optical amplifier system of any of the Examples above, wherein an average width of a first longitudinal segment closer to the input port is smaller larger than an average width of a second longitudinal segment closer to the output port.

Example 29. The optical amplifier system of any of any of the Examples above, wherein an average width of central lateral segments of longitudinal segments increases from the input port to the output port along the longitudinal direction.

Example 30. The optical amplifier system of any of Examples above, further comprising a semiconductor laser configured to generate laser light and provide the laser light to the optical amplifier system via the input port, wherein the semiconductor laser comprises:

a front optical reflector, a back optical reflector, said front and back optical reflectors disposed with respect to each other to form a laser cavity therebetween, and a second active waveguide extending in the longitudinal direction between the front optical reflector and the back optical reflector, wherein the second active waveguide comprises a second gain layer configured to provide optical gain to light propagating within the second active waveguide.

Example 31. The optical amplifier system of Example 30, wherein the semiconductor laser comprises a second electrode disposed with respect to the second active waveguide, said second electrode comprising a second plurality of separate electrically isolated longitudinal segments arranged in the longitudinal direction;

wherein the electronic control system configured to provide second individually controlled currents and/or voltages to individual second longitudinal segments so as to increase uniformity of a second longitudinal distribution of injection current provided to the second gain layer.

Example 32. The optical amplifier system of Example 30, wherein the semiconductor laser further comprises a non-segmented electrode disposed with respect to the second active waveguide.

Example 33. The optical amplifier system of Example 30 and 31, wherein the second active waveguide has a second waveguide width along a lateral direction perpendicular to the longitudinal direction, and wherein the second waveguide width increases at least along a portion of the waveguide length in the longitudinal direction.

Example 34. The semiconductor system of Example 30 and 31, wherein the second active waveguide has a second waveguide width along a lateral direction perpendicular to the longitudinal direction, and wherein an average value of the second waveguide width is constant along the waveguide length in the longitudinal direction.

Example 35. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide said electrode comprise a plurality of separate electrically isolated longitudinal segments arranged in the longitudinal direction, wherein an individual longitudinal segment has a length along the longitudinal direction and an electrode width along the lateral direction; and wherein the width of an individual longitudinal segment does not increase and decrease multiple times along the longitudinal direction.

Example 36. The optical amplifier system of Example 35, wherein the waveguide width increases at least along a portion of the waveguide length in the longitudinal direction.

Example 37. The optical amplifier system of Example 36, wherein the width of an individual longitudinal segment increases along the longitudinal direction.

Example 38. The optical amplifier system of Example 35, wherein an average value of the waveguide width is constant at least along a portion of the waveguide length in the longitudinal direction.

Example 39. The optical amplifier system of Example 38, wherein the width of an individual longitudinal segment is constant along the longitudinal direction.

Example 40. The optical amplifier system of any of Examples 35-39, further comprising an electronic control system configured to provide individually controlled currents and/or voltages to individual longitudinal segments.

Example 41 The optical amplifier system of any of Examples 35-40, wherein the individual longitudinal segment does not include a protrusion.

Example 42 The optical amplifier system of any of Examples 35-41, wherein the width of an individual longitudinal segment does not increase and decrease in width.

Example 43 The optical amplifier system of any of Examples 35-42, wherein the width of an individual longitudinal segment does not decrease along the longitudinal direction.

Example 44. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide;

a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the output port compared to the third end; and an electronic control system configured to at least provide a first current to the first conductive pad and a second current to the second conductive pad so as to increase uniformity of a longitudinal distribution of injection current provided to the gain layer.

Example 45. The optical amplifier system of Example 44 above, wherein the electrode comprises a top electrode.

Example 46. The optical amplifier system of Example 45, wherein top electrode is segmented.

Example 47. The optical amplifier system of Example 45, wherein top electrode is not segmented.

Example 48. The optical amplifier system of Example 44, wherein the electrode comprises a bottom electrode.

Example 49. The optical amplifier system of Example 48, wherein the bottom electrode is segmented.

Example 50. The optical amplifier system of Example 48, wherein the bottom electrode is not segmented.

Example 51. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction; and an electronic control system configured to provide individually controlled currents and/or voltages to individual longitudinal segments.

Example 52. The optical amplifier system of Example 51, wherein the electrode comprises a top electrode.

Example 53. The optical amplifier system of Example 51, wherein the electrode comprises a bottom electrode.

Example 54. The optical amplifier system of any of Examples 51-53, wherein the electronic control system is configured to provide individually controlled currents and/or voltages to the individual longitudinal segments to increase the optical power of the output portion of the amplified portion of the input light.

Example 55. The optical amplifier system of any of Examples 51-53, wherein the electronic control system is configured to provide individually controlled currents and/or voltages to the individual longitudinal segments to increase a slope efficiency of the semiconductor laser.

Example 56. The optical amplifier system of any of Examples 51-55, further comprising a photodetector configured to receive at least a portion of amplified light produced by the semiconductor laser system and generate a signal indicative of an optical power of the amplified light.

Example 57. The optical amplifier system Example 56, wherein the photodetector receives the at least a portion of the laser light via the output port.

Example 58. The optical amplifier system of any of Examples 56 and 57, wherein the electronic control system is configured to provide individually controlled currents and/or voltages to the individual longitudinal segments based at least in part on the signal received from the photodetector.

Example 59. The optical amplifier system of any of Examples 51-59, wherein the electronic control system is configured to provide individually controlled currents and/or voltages to individual longitudinal segments so as to tailor a longitudinal distribution of injection current provided to the gain layer.

Example 60. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide;

a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the output port compared to the third end; and an electronic control system configured to at least provide a first current to the first conductive pad and a second current to the second conductive pad.

Example 61. The optical amplifier system of Example 60, wherein the electrode comprises a top electrode.

Example 62. The optical amplifier system of Example 61, wherein top electrode is segmented.

Example 63. The optical amplifier system of Example 61, wherein top electrode is not segmented.

Example 64. The optical amplifier system of Example 60, wherein the electrode comprises a bottom electrode.

Example 65. The optical amplifier system of Example 64, wherein the bottom electrode is segmented.

Example 66. The optical amplifier system of Example 64, wherein the bottom electrode is not segmented.

Example 67. The optical amplifier system of any of Examples 60-66, wherein the electronic control system is configured to at least provide a first current to the first conductive pad and a second current to the second conductive pad so as to tailor a longitudinal distribution of injection current provided to the gain layer.

Example 67. The optical amplifier system of any of Examples 1-11, 16-34 and 51-59, wherein the width of an individual longitudinal segment does not increase and decrease multiple times along the longitudinal direction.

Example 68. The optical amplifier system of any of the Examples 1-11 16-34, 51-59, and 67 wherein the individual longitudinal segment does not include a protrusion.

Example 69. The optical amplifier system of any of the Examples 1-11 16-34, 51-59, and 67-68 wherein the width of an individual longitudinal segment does not increase and decrease in width.

Example 70. The optical amplifier system of any of Examples 1-11, 16-34, 51-59, and 67-69 wherein the width of an individual longitudinal segment does not decrease along the longitudinal direction.

Example 71. The optical amplifier system of any of Examples 1-26, 30-34, 51-59, and 67-70 wherein the active waveguide is not flared.

Group 4

Example 1. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:

an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide;

an electrode disposed with respect to the active waveguide said electrode comprise a plurality of separate electrically isolated longitudinal segments arranged in the longitudinal direction, wherein an individual longitudinal segment has a length along the longitudinal direction and an electrode width along the lateral direction;

wherein the active waveguide is not flared.

Example 2. The optical amplifier system of Example 1, further comprising an electronic control system configured to provide individually controlled currents and/or voltages to individual longitudinal segments to make the longitudinal distribution of injection current provided to the gain layer more uniform than a longitudinal injection current distribution generated by a non-segmented electrode.

Example 3. The optical amplifier system of any of the Examples above, wherein the active waveguide comprises a III-V compound semiconductor.

Example 4. The optical amplifier system of any of the Examples above, wherein the lengths of the longitudinal segments are equal to each other.

Example 5. The optical amplifier system of any of the Examples above, wherein the widths of the longitudinal segments are equal to each other.

Example 6. The optical amplifier system of any of Examples above, wherein said separate longitudinal segments are equally spaced in the longitudinal direction.

Example 7. The optical amplifier system of any of Examples above, wherein the lengths of at least two longitudinal sections are not equal.

Example 8. The optical amplifier system of any of Example 1-4 and 6-7, wherein the widths of at least two longitudinal sections are not equal.

Example 9. The optical amplifier system of any of Examples 1-5 and 7-8, wherein a spacing between at least two consecutive longitudinal segments is smaller than the lengths of the at least two longitudinal segments.

Example 10. The optical amplifier system of any of Examples above, wherein an individual longitudinal segment is extended symmetrically in the lateral direction with respect to a centerline of the active waveguide.

Example 11. The optical amplifier system of any of Examples above, wherein an individual longitudinal segment comprises a rectangular shape.

Example 12. The optical amplifier system of any of Examples above, wherein the width of an individual longitudinal segment increases and decreases multiple times with position along the length of the longitudinal segment.

Example 13. The optical amplifier system of Example 12, wherein the width of the individual longitudinal segment increases and decreases linearly.

Example 14. The optical amplifier system of Example 12, wherein the width of the individual longitudinal segment increases and decreases nonlinearly.

Example 15. The optical amplifier system of any of Examples above, wherein a lateral edge of an individual longitudinal segment comprises a shape so as to provide an injection current distribution to the gain layer having an average width equal to the average width of the individual segment.

Example 16. The optical amplifier system of any of Examples above, wherein an individual longitudinal segment comprises two or more lateral segments.

Example 17. The optical amplifier system of Example 16, wherein an individual lateral segment has a length in the longitudinal direction, wherein the lengths of individual lateral segments are equal.

Example 18. The optical amplifier system of Example 16, wherein the lateral segments extend symmetrically in the lateral direction with respect to a centerline of the active waveguide.

Example 19. The optical amplifier system of Example 16, wherein a lateral segment comprises a rectangular shape.

Example 20. The optical amplifier system of any of Examples above, wherein the electrode comprises a top electrode.

Example 21. The optical amplifier system of any of Examples above, wherein the electrode comprises a bottom electrode.

Example 22. The optical amplifier system of any of Examples above, wherein the electronic control system is configured to provide individually controlled currents and/or voltages to the individual longitudinal segments to increase an efficiency of the optical amplifier system.

Example 23. The optical amplifier system of any of Examples 1-11, and 16-22, wherein the width of an individual longitudinal segment does not increase and decrease multiple times along the longitudinal direction.

Example 24. The optical amplifier system of any of the Examples 1-11 and 16-23 wherein the individual longitudinal segment does not include a protrusion.

Example 25. The optical amplifier system of any of the Examples 1-11 and 16-24 wherein the width of an individual longitudinal segment does not increase and decrease in width.

Example 26. The optical amplifier system of any of Examples 1-11 and 16-25 wherein the width of an individual longitudinal segment does not decrease along the longitudinal direction.

Example 27. The optical amplifier system of any of Examples 1 and 3-26, further comprising an electronic control system configured to provide individually controlled currents and/or voltages to individual longitudinal segments Example 28. The optical amplifier system of Example 27, wherein the electronic control system is configured to provide individually controlled currents and/or voltages to the individual longitudinal segments to increase an optical power of amplified light.

Example 29. The optical amplifier system of any of Examples 27-28, wherein the electronic control system is configured to provide individually controlled currents and/or voltages to the individual longitudinal segments to increase a slope efficiency of the semiconductor laser.

Example 30. The optical amplifier system of any of Examples 27-29, further comprising a photodetector configured to receive at least a portion of laser light generated by the semiconductor laser system and generate a signal indicative of an optical power of the amplified light.

Example 31. The optical amplifier system Example 30, wherein the photodetector receives the at least a portion of the amplified light via the front reflector.

Example 32. The optical amplifier system of any of Examples 30 and 31, wherein the electronic control system is configured to provide individually controlled currents and/or voltages to the individual longitudinal segments based at least in part on the signal received from the photodetector.

Example 33. The optical amplifier system of any of the example above, wherein the electronic control system is configured to provide individually controlled currents and/or voltages to individual longitudinal segments so as to tailor a longitudinal distribution of injection current provided to the gain layer.

Example 34. The optical amplifier system of any of Examples 1, and 2-26, further comprising an electronic control system configured to provide individually controlled currents and/or voltages to individual longitudinal segments so as to increase uniformity of a longitudinal distribution of injection current provided to the gain layer.

Group 5

Example 1. A semiconductor laser system comprising:
a semiconductor laser comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide to apply an electrical voltage to said gain layer;

an electronic control system configured to provide individually controlled currents and/or voltages to individual longitudinal regions of the electrode via conductive lines distributed across the individual longitudinal regions in number so as to increase uniformity of a longitudinal distribution of injection current provided to the gain layer.

Example 2. The semiconductor laser system of Example 1, wherein the conductive lines comprise a first group of conductive lines having a first number of individual conductive lines and connected to a first longitudinal region, and a second group of conductive lines having a second number of individual conductive lines connected to a second longitudinal region, wherein the first number is different from the second number.

Example 3. The semiconductor laser system of Example 2, wherein the first number is smaller than the second number.

Example 4 The semiconductor laser system of Example 2, wherein the first number is larger than the second number.

Example 5. The semiconductor laser system of any of Examples above, wherein, the electrode is non-segmented.

Example 6. The semiconductor laser system of any of Examples above, further comprising a photodetector configured to receive at least a portion an optical power of laser light and generate a signal indicative of an optical power of laser light.

Example 7. The semiconductor laser of Example 6, wherein the electronic control system is configured to provide individually controlled currents and/or voltages to the individual longitudinal segments based at least in part on the signal received from the photodetector.

Example 8. The semiconductor laser of any of Examples above, wherein the electronic control system is configured to provide individually controlled currents and/or voltages to the individual longitudinal segments to increase the optical power of laser light output via the front reflector.

Example 9. The semiconductor laser system of any of Examples above, wherein the waveguide width increases at least along a portion of the waveguide length in the longitudinal direction.

Example 10. The semiconductor laser system of any of Examples above, wherein the waveguide width is not flared.

Example 11. The semiconductor laser system of any of Examples above, the first longitudinal region in closer to the front optical reflector compared to a second longitudinal region.

Group 6

Example 1. An optical amplifier system configured to receive input light via an input port to be guided therein, amplify at least a portion of the input light that is guided in the optical amplifier system, and output at least a portion of the amplified portion of the input light via an output port, wherein the optical amplifier system comprises:
an active waveguide extending in a longitudinal direction between the input port and the output port an active waveguide extending in a longitudinal direction between the input port and the output port and having a waveguide width extending in a lateral direction perpendicular to the longitudinal direction, wherein the active waveguide comprises a gain layer configured to provide optical gain to light guided in the active waveguide; and
an electrode disposed with respect to the active waveguide with respect to the active waveguide to apply an electrical voltage to said gain layer;

an electronic control system configured to provide individually controlled currents and/or voltages to individual longitudinal regions of the electrode via conductive lines distributed across the individual longitudinal regions in number so as to increase uniformity of a longitudinal distribution of injection current provided to the gain layer Example 2. The optical amplifier system of Example 1, wherein the conductive lines comprise a first group of conductive lines having a first number of individual conductive lines and connected to a first longitudinal region, and a second group of individual conductive lines having a second number of conductive lines connected to a second longitudinal region, wherein the first number is different from the second number, and wherein.

Example 3. The optical amplifier system of Example 2, wherein the first number is smaller than the second number Example 4. The optical amplifier system of Example 2, wherein the first number is larger than the second number.

Example 5. The optical amplifier system of any of Examples above, wherein, the electrode is non-segmented.

Example 6. The optical amplifier system of any of Examples above, further comprising a photodetector configured to receive at least a portion of the amplified portion of the input light and generate a signal indicative of an optical power of the amplified portion of the input light.

Example 7. The optical amplifier system of any of Examples above, further comprising a photodetector configured to receive at least a portion of light guided in the active waveguide and generate a signal indicative of an optical power of a portion of the amplified portion of the input light, output via the output port.

Example 8. The optical amplifier system of any of Examples 6 and 7, wherein the electronic control system is configured to provide individually controlled currents and/or voltages to individual longitudinal regions of the electrode based at least in part on the signal received from the photodetector.

Example 9. The optical amplifier system of any of the examples above, wherein the electronic control system is configured to provide individually controlled currents and/or voltages to the individual longitudinal regions to increase an optical power of the amplified portion of the input light.

Example 10. The optical amplifier system of any of Examples above, wherein the waveguide width increases at least along a portion of the waveguide length in the longitudinal direction.

Example 11. The optical amplifier system of any of Examples above, wherein the waveguide width is not flared.

Example 12. The optical amplifier system of any of Examples above, the first longitudinal region in closer to the front optical reflector compared to a second longitudinal region.

Group 7

Example 1. A semiconductor laser system comprising:

a semiconductor laser comprising:

a front optical reflector, a back optical reflector, said front and back optical reflectors disposed with respect to each other to form a laser cavity therebetween, an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;

an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction; and an electronic control system configured to provide individually controlled currents and/or voltages to individual longitudinal segments so as to increase uniformity of a longitudinal distribution of injection current provided to the gain layer.

Example 2. The semiconductor laser of Example 1, wherein the semiconductor laser is a broad area laser.

Example 3. The semiconductor laser of Example 1, wherein the semiconductor laser is a Fabry-Perot laser.

Example 4. The semiconductor laser of any of the Examples above, wherein the reflectivity of the front reflector is smaller than the reflectivity of the back reflector.

Example 5. The semiconductor laser of any of the Examples above, wherein the active waveguide comprises a III-V compound semiconductor.

Example 6. The semiconductor laser of any of the Examples above, wherein the lengths of the longitudinal segments are equal to each other.

Example 7. The semiconductor laser any of the Examples above, wherein the widths of the longitudinal segments are equal to each other.

Example 8. The semiconductor laser of any of Examples above, wherein said separate longitudinal segments are equally spaced in the longitudinal direction.

Example 9. The semiconductor laser of any of Examples above, wherein the lengths of at least two longitudinal sections are not equal.

Example 10. The semiconductor laser of Example 1, wherein the widths of at least two longitudinal sections are not equal.

Example 11. The semiconductor laser of any of Examples 1, 7, 9 and 10 wherein a spacing between at least two consecutive longitudinal segments is smaller than the lengths of the at least two longitudinal segments.

Example 12. The semiconductor laser of any of Examples above, wherein an individual longitudinal segment is extended symmetrically in the lateral direction with respect to a centerline of the active waveguide.

Example 13. The semiconductor laser of any of Examples above, wherein an individual longitudinal segment comprises a rectangular shape.

Example 14. The semiconductor laser of any of Examples 2-8, wherein the width of an individual longitudinal segment increases and decreases multiple times with position along the length of the longitudinal segment.

Example 15. The semiconductor laser of Example 14, wherein the width of the individual longitudinal segment increases and decreases linearly.

Example 16. The semiconductor laser of Example 14, wherein the width of the individual longitudinal segment increases and decreases nonlinearly.

Example 17. The semiconductor laser of any of Examples above, wherein a lateral edge of an individual longitudinal segment comprises a shape so as to provide an injection current distribution to the gain layer having an average width equal to the average width of the individual segment.

Example 18. The semiconductor laser of any of Examples above, wherein an individual longitudinal segment comprises two or more lateral segments.

Example 19. The semiconductor laser of Example 18, wherein an individual lateral segment has a length in the longitudinal direction, wherein the lengths of individual lateral segments are equal.

Example 20. The semiconductor laser of Example 18, wherein the lateral segments extend symmetrically in the lateral direction with respect to a centerline of the active waveguide.

Example 21. The semiconductor laser of Example 18, wherein a lateral segment comprises a rectangular shape.

Example 22. The semiconductor laser of any of Examples above, wherein the electrode comprises a top electrode.

Example 23. The semiconductor laser of any of Examples above, wherein the electrode comprises a bottom electrode.

Example 24. The semiconductor laser of any of Examples above, wherein the electronic control system is configured to provide individually controlled currents and/or voltages to the individual longitudinal segments to increase a slope efficiency of the semiconductor laser.

Example 25. The semiconductor laser of any of Examples above, wherein the electronic control system is configured to provide individually controlled currents and/or voltages to the individual longitudinal segments based at least in part on an optical power of laser light output via the front reflector.

Example 26. The semiconductor laser of Example 25, wherein the electronic control system is configured to provide individually controlled currents and/or voltages to the individual longitudinal segments to increase an optical power of laser light output via the front reflector.

Example 27. A semiconductor laser system comprising:
a semiconductor laser chip comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide;
a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the front reflector compared to the third end; and
an electronic control system configured to at least provide a first current to the first conductive pad and a second current to the second conductive pad so as to increase uniformity of a longitudinal distribution of injection current provided to the gain layer.

Example 28. The semiconductor laser system of Example 27 above, wherein the electrode comprises a top electrode.

Example 29. The semiconductor laser system of Example 28, wherein top electrode is segmented.

Example 30. The semiconductor laser system of Example 28, wherein top electrode is not segmented.

Example 31. The semiconductor laser system of Example 27, wherein the electrode comprises a bottom electrode.

Example 32. The semiconductor laser system of Example 31, wherein the bottom electrode is segmented.

Example 33. The semiconductor laser system of Example 31, wherein the bottom electrode is not segmented.

Example 34. A semiconductor laser system comprising:
a semiconductor laser comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction; and
an electronic control system configured to provide individually controlled currents and/or voltages to individual longitudinal segments.

Example 35. The semiconductor laser of Example 34, wherein the electrode comprises a top electrode.

Example 36. The semiconductor laser of Example 34, wherein the electrode comprises a bottom electrode.

Example 37. A semiconductor laser system comprising:
a semiconductor laser chip comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide;
a submount comprising at least two electrically isolated conductive pads wherein a first conductive pad is electrically connected to a first region of the electrode and a second conductive pad is connected to a second region of the electrode separate from the first region, said first region extending in the longitudinal direction between a first end and second end, said second region extending in the longitudinal direction between a third end and a fourth end, and wherein the first end closer to the front reflector compared to the third end; and an electronic control system configured to at least provide a first current to the first conductive pad and a second current to the second conductive pad.

Example 38. The semiconductor laser system of Example 37 above, wherein the electrode comprises a top electrode.

Example 39. The semiconductor laser system of Example 38, wherein top electrode is segmented.

Example 40. The semiconductor laser system of Example 38, wherein top electrode is not segmented.

Example 41. The semiconductor laser system of Example 37, wherein the electrode comprises a bottom electrode.

Example 42. The semiconductor laser system of Example 41, wherein the bottom electrode is segmented.

Example 43. The semiconductor laser system of Example 41, wherein the bottom electrode is not segmented.

Example 44. The semiconductor laser system of any of Examples 37-43, wherein the electronic control system is configured to at least provide a first current to the first conductive pad and a second current to the second conductive pad so as to tailor a longitudinal distribution of injection current provided to the gain layer.

Example 45. The semiconductor laser of any of Examples 34-36, wherein the electronic control system is configured to an electronic control system configured to provide individually controlled currents and/or voltages to individual longitudinal segments so as to tailor a longitudinal distribution of injection current provided to the gain layer.

TERMINOLOGY

Conditional language, such as "can," "could," "might," or "may," unless specifically stated otherwise, or otherwise understood within the context as used, is generally intended to convey that certain embodiments, implementations, or examples include, while other embodiments, implementations, examples do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A semiconductor laser system comprising:
a semiconductor laser comprising:
a front optical reflector,
a back optical reflector,
said front and back optical reflectors disposed with respect to each other to form a laser cavity therebetween,
an active waveguide extending in a longitudinal direction between the front optical reflector and the back optical reflector, wherein said active waveguide comprises a gain layer configured to provide optical gain to light propagating within said active waveguide, said waveguide having a waveguide length along the longitudinal direction and a waveguide width along a lateral direction perpendicular to the longitudinal direction;
an electrode disposed with respect to the active waveguide said electrode comprise a plurality of separate electrically isolated longitudinal segments arranged in the longitudinal direction, wherein an individual longitudinal segment has a length along the longitudinal direction and a width along a lateral direction perpendicular to the longitudinal direction and at least one of the plurality of separate electrically isolated longitudinal segments includes a plurality of separate electrically isolated lateral segments arranged in a lateral direction perpendicular to the longitudinal direction; and
an electronic control system configured to provide individually controlled currents and/or voltages to individual longitudinal segments and individual lateral segments so as to increase uniformity of a longitudinal distribution of injection current provided to the gain layer.

2. The semiconductor laser of claim 1, wherein the reflectivity of the front reflector is smaller than the reflectivity of the back reflector.

3. The semiconductor laser of any of claim 1, wherein the active waveguide comprises a III-V compound semiconductor.

4. The semiconductor laser of any of claim 1, wherein the width of an individual longitudinal segment increases and decreases multiple times with position along the length of the longitudinal segment.

5. The semiconductor laser of claim 4, wherein the width of the individual longitudinal segment increases and decreases linearly.

6. The semiconductor laser of claim 4, wherein the width of the individual longitudinal segment increases and decreases nonlinearly.

7. The semiconductor laser of claim 1, wherein a lateral edge of an individual longitudinal segment comprises a shape so as to provide an injection current distribution to the gain layer having an average width equal to the average width of the individual segment.

8. The semiconductor laser of claim 1, wherein wherein the electronic control system is configured to provide the individually controlled currents and/or voltages to the individual lateral segments to control a lateral mode profile of the light propagating within the active waveguide.

9. The semiconductor laser of claim 1, wherein an individual lateral segment has a length in the longitudinal direction, wherein the lengths of individual lateral segments are equal.

10. The semiconductor laser of claim 1, wherein the lateral segments extend symmetrically in the lateral direction with respect to a centerline of the active waveguide.

11. The semiconductor laser of claim 1, wherein a lateral segment comprises a rectangular shape.

12. The semiconductor laser of claim 1, wherein the electrode comprises a top electrode.

13. The semiconductor laser of claim 1, wherein the electrode comprises a bottom electrode.

14. The semiconductor laser of claim 1, wherein the electronic control system is configured to provide individually controlled currents and/or voltages to the individual longitudinal segments to increase a slope efficiency of the semiconductor laser.

15. The semiconductor laser of claim 1, wherein the electronic control system is configured to provide individually controlled currents and/or voltages to the individual longitudinal segments based at least in part on an optical power of laser light output via the front reflector.

16. The semiconductor laser of claim 15, wherein the electronic control system is configured to provide individually controlled currents and/or voltages to the individual longitudinal segments to increase an optical power of laser light output via the front reflector.

* * * * *